US011594068B2

(12) United States Patent
Lee et al.

(10) Patent No.: US 11,594,068 B2
(45) Date of Patent: Feb. 28, 2023

(54) DISPLAY DEVICE HAVING FINGERPRINT SENSING FUNCTION AND METHOD OF OPERATING THE SAME

(71) Applicant: Samsung Display Co., Ltd., Yongin-si (KR)

(72) Inventors: Soongyu Lee, Daegu (KR); Jinwoo Kim, Hwaseong-si (KR); Kyowon Ku, Seoul (KR); Youngsik Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 17/248,888

(22) Filed: Feb. 11, 2021

(65) Prior Publication Data

US 2021/0326572 A1 Oct. 21, 2021

(30) Foreign Application Priority Data

Apr. 20, 2020 (KR) .................. 10-2020-0047231

(51) Int. Cl.
| | |
|---|---|
| *G06K 9/00* | (2022.01) |
| *G06V 40/12* | (2022.01) |
| *H01L 27/32* | (2006.01) |
| *G06V 40/50* | (2022.01) |
| *G06V 40/13* | (2022.01) |
| *G09G 5/00* | (2006.01) |

(52) U.S. Cl.
CPC ...... *G06V 40/1365* (2022.01); *G06V 40/1306* (2022.01); *G06V 40/50* (2022.01); *G09G 5/00* (2013.01); *H01L 27/3234* (2013.01)

(58) Field of Classification Search
CPC .......... G06V 40/1365; G06V 40/1306; G06V 40/50; G06V 40/40; G06V 40/1376; G06V 40/1359; H01L 27/3234; G09G 5/00; G06F 3/0412
USPC ........................................................ 382/124
See application file for complete search history.

(56) References Cited

U.S. PATENT DOCUMENTS

| 8,699,799 B2 | 4/2014 | Moon et al. | |
|---|---|---|---|
| 9,396,381 B2 | 7/2016 | Yi et al. | |
| 2003/0068072 A1* | 4/2003 | Hamid | G06V 40/1306 382/124 |
| 2004/0096087 A1* | 5/2004 | Funahashi | G06V 40/40 382/124 |
| 2018/0173922 A1* | 6/2018 | Ghavanini | G06F 3/0412 |

(Continued)

FOREIGN PATENT DOCUMENTS

| KR | 10-0819457 B1 | 4/2008 |
|---|---|---|
| KR | 10-1087833 B1 | 11/2011 |

(Continued)

*Primary Examiner* — Abdul-Samad A Adediran
(74) *Attorney, Agent, or Firm* — Lewis Roca Rothgerber Christie LLP

(57) ABSTRACT

A display device includes: a display unit configured to display an image; a fingerprint sensing unit on one surface of the display unit and comprising fingerprint sensing pixels configured to sense a fingerprint; and a readout circuit configured to receive a fingerprint sensing signal from the fingerprint sensing pixels, wherein the readout circuit is configured to generate and output a normal fingerprint image and a dry fingerprint image, which correspond to the fingerprint sensing signal, during a fingerprint registration mode.

20 Claims, 19 Drawing Sheets

(56) References Cited

U.S. PATENT DOCUMENTS

| | | | |
|---|---|---|---|
| 2018/0349667 A1* | 12/2018 | Kim | G09G 5/00 |
| 2019/0188448 A1 | 6/2019 | Kim et al. | |
| 2019/0197287 A1 | 6/2019 | Han et al. | |
| 2019/0236325 A1* | 8/2019 | Zeng | G06V 40/1376 |
| 2019/0340455 A1* | 11/2019 | Jung | G06V 40/1359 |
| 2021/0019489 A1* | 1/2021 | Cho | G06F 3/0412 |

FOREIGN PATENT DOCUMENTS

| | | |
|---|---|---|
| KR | 10-1255555 B1 | 4/2013 |
| KR | 10-1444064 B1 | 9/2014 |
| KR | 10-1976362 B1 | 5/2019 |
| KR | 10-2019-0074782 A | 6/2019 |
| KR | 10-2019-0075755 A | 7/2019 |

\* cited by examiner

DISPLAY DEVICE HAVING FINGERPRINT SENSING FUNCTION AND METHOD OF OPERATING THE SAME

CROSS-REFERENCE TO RELATED APPLICATION

The present application claims priority to and the benefit of Korean Patent Application No. 10-2020-0047231, filed on Apr. 20, 2020, the entire content of which is hereby incorporated by reference.

BACKGROUND

1. Field

Aspects of some example embodiments of the present disclosure relate to a display device having a fingerprint sensing function.

2. Description of the Related Art

Multimedia electronic apparatuses, such as televisions, mobile phones, tablet computers, computers, navigation units, and game units, include a display device to display images. Some electronic apparatuses include a display device that provides, in addition to usual input methods, such as a button, a keyboard, a mouse, etc., a touch-based input method that allows users to relatively easily and intuitively input information or commands.

Additionally, as a user authentication method for online banking, product purchases, and security, consumer demand for display devices having a fingerprint recognition function is increasing.

The above information disclosed in this Background section is only for enhancement of understanding of the background and therefore the information discussed in this Background section does not necessarily constitute prior art.

SUMMARY

Aspects of some example embodiments of the present disclosure include a display device capable of sensing a fingerprint.

Aspects of some example embodiments of the present disclosure include a display device capable of improving a fingerprint authentication performance regardless of a skin state.

According to some example embodiments of the inventive concept, a display device includes a display unit displaying an image, a fingerprint sensing unit disposed on one surface of the display unit and including fingerprint sensing pixels to sense a fingerprint, and a readout circuit receiving a fingerprint sensing signal from the fingerprint sensing pixels. The readout circuit generates and outputs a normal fingerprint image and a dry fingerprint image, which correspond to the fingerprint sensing signal, during a fingerprint registration mode.

According to some example embodiments, the readout circuit generates the dry fingerprint image corresponding to the fingerprint sensing signal and outputs the dry fingerprint image when a matching score of the dry fingerprint image and the normal fingerprint image is greater than a reference score.

According to some example embodiments, the readout circuit further includes a memory that stores an algorithm used to generate the dry fingerprint image corresponding to the fingerprint sensing signal, and the readout circuit calculates the matching score indicating a match degree of the dry fingerprint image generated by the algorithm and the normal fingerprint image.

According to some example embodiments, the readout circuit outputs a fingerprint template including a normal fingerprint template corresponding to the normal fingerprint image and a dry fingerprint template corresponding to the dry fingerprint image.

According to some example embodiments, the fingerprint template includes a plurality of normal fingerprint templates and a plurality of dry fingerprint templates.

According to some example embodiments, the readout circuit generates a fingerprint image corresponding to the fingerprint sensing signal during a fingerprint authentication mode and compares the generated fingerprint image with the fingerprint template.

According to some example embodiments, the readout circuit generates the dry fingerprint image corresponding to the fingerprint sensing signal during a fingerprint authentication mode, converts the dry fingerprint image to the normal fingerprint image, and compares the normal fingerprint image with the fingerprint template.

According to some example embodiments, the readout circuit further includes a memory to store the fingerprint template.

According to some example embodiments, the display unit includes a display area in which the pixels are arranged and a non-display area defined adjacent to the display area, and the fingerprint sensing pixels of the fingerprint sensing unit are arranged in a fingerprint sensing area corresponding to the display area.

According to some example embodiments, each of the fingerprint sensing pixels is connected to a corresponding fingerprint scan line among a plurality of fingerprint scan lines and a corresponding fingerprint sensing line among a plurality of fingerprint sensing lines, and the fingerprint sensing unit further includes a fingerprint scan driving circuit that sequentially drives the fingerprint scan lines.

According to some example embodiments, the readout circuit receives the fingerprint sensing signal from the fingerprint sensing lines.

According to some example embodiments of the inventive concept, in a method of operating a display device in a fingerprint registration mode and a fingerprint authentication mode, the method in the fingerprint registration mode includes receiving a fingerprint sensing signal, generating a normal fingerprint image corresponding to the fingerprint sensing signal, generating a dry fingerprint image corresponding to the fingerprint sensing signal, and outputting the normal fingerprint image and the dry fingerprint image.

According to some example embodiments, the outputting of the normal fingerprint image and the dry fingerprint image includes outputting the normal fingerprint image and the dry fingerprint image when the normal fingerprint image is matched with the dry fingerprint image.

According to some example embodiments, the outputting of the normal fingerprint image and the dry fingerprint image includes outputting the normal fingerprint image and the dry fingerprint image when a matching score of the normal fingerprint image and the dry fingerprint image is greater than a reference score.

According to some example embodiments, the method further includes outputting a fingerprint template including a normal fingerprint template corresponding to the normal fingerprint image and a dry fingerprint template corresponding to the dry fingerprint image.

According to some example embodiments, the method further includes receiving the fingerprint sensing signal, generating a fingerprint image corresponding to the fingerprint sensing signal, comparing the fingerprint image with the fingerprint template, and determining that a user authentication is successful in response to the fingerprint image matching with the fingerprint template in the fingerprint authentication mode.

According to some example embodiments, the method further includes comparing the fingerprint image with the normal fingerprint template in the fingerprint template and comparing the fingerprint image with the dry fingerprint template in the fingerprint template when the fingerprint image is not matched with the normal fingerprint template in the fingerprint authentication mode.

According to some example embodiments, the method further includes determining that the user authentication is successful in response to the fingerprint image matching with at least one of the normal fingerprint template or the dry fingerprint template.

According to some example embodiments, the generating of the fingerprint image corresponding to the fingerprint sensing signal includes determining whether the fingerprint image is a dry fingerprint image, converting the dry fingerprint image to the normal fingerprint image when it is determined that the fingerprint image is the dry fingerprint image, comparing the normal fingerprint image with the normal fingerprint template in the fingerprint template, and comparing the normal fingerprint image with the dry fingerprint template in the fingerprint template when the normal fingerprint image is not matched with the normal fingerprint template.

According to some example embodiments, the generating of the dry fingerprint image corresponding to the fingerprint sensing signal in the fingerprint registration mode is performed when a dry fingerprint automatic registration is selected by a user.

Thus, according to some example embodiments according to the present disclosure, a display device may sense a fingerprint from a user. The display device may register in advance not only the normal fingerprint template but also the dry fingerprint template in the fingerprint registration mode based on the fingerprint input by the user. The display device may determine whether or not the fingerprint input by the user matches with the normal fingerprint template and the dry fingerprint template in the fingerprint authentication mode and may perform the fingerprint authentication operation. For example, because the fingerprint authentication errors may be reduced in a state where the user's skin is dry the display device may provide convenience to the user.

BRIEF DESCRIPTION OF THE DRAWINGS

The above and other characteristics of embodiments according to the present disclosure will become readily apparent by reference to the following detailed description when considered in conjunction with the accompanying drawings wherein.

DETAILED DESCRIPTION

Figure 1:
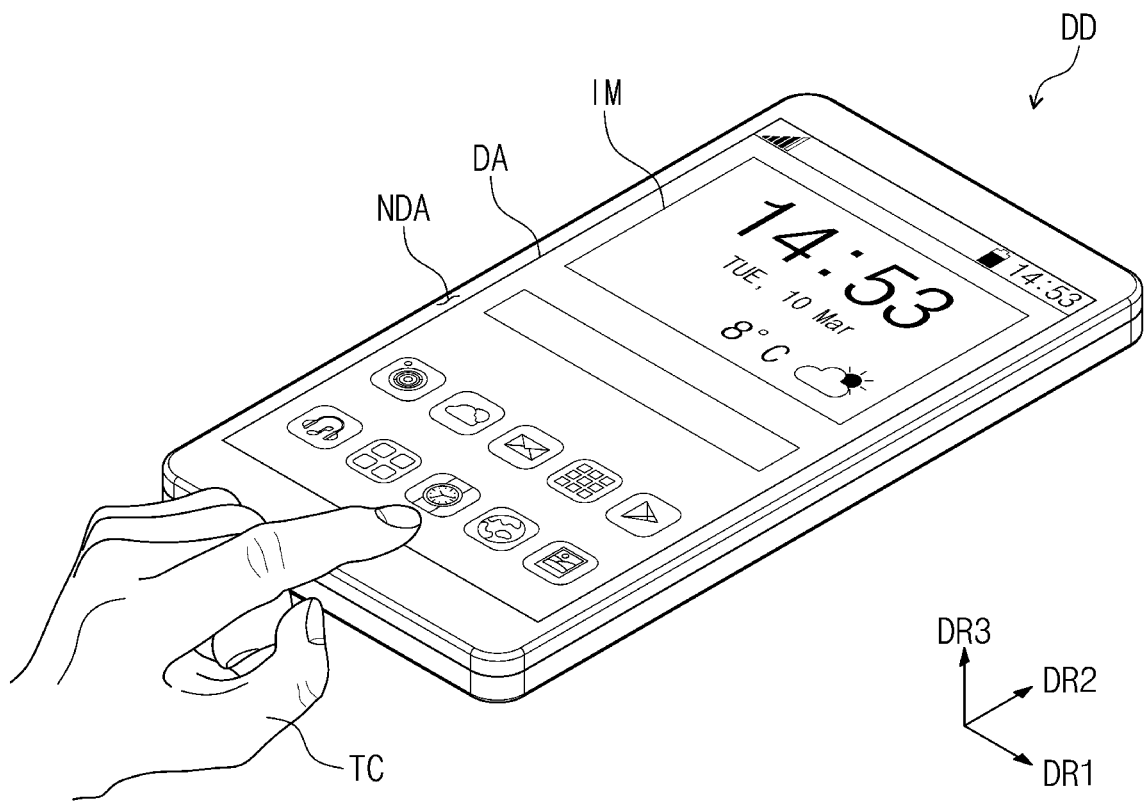
FIG. 1 is a perspective view showing a display device according to some example embodiments of the present disclosure.

In the following descriptions, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in more detail with reference to the accompanying drawings.

FIG. 1 is a perspective view showing a display device DD according to some example embodiments of the present disclosure.

FIG. 1 shows a mobile terminal as a representative example of the display device DD according to some example embodiments of the present disclosure. The mobile terminal may include a tablet PC, a smartphone, a personal digital assistant (PDA), a portable multimedia player (PMP), a game unit, a wristwatch-type electronic device, or the like, however, it should not be limited thereto or thereby.

The display device DD of the present disclosure may be applied to a large-sized electronic item, such as a television set or an outdoor billboard, and a small and medium-sized electronic item, such as a personal computer, a notebook computer, a car navigation unit, and a camera. These are merely examples, and thus, the display device DD may be applied to other electronic devices as long as they do not depart from the spirit and scope of embodiments according to the present disclosure.

As shown in FIG. 1, a display surface through which an image IM is displayed may be substantially parallel to a plane defined by a first direction DR1 and a second direction DR2. The display device DD may include a plurality of areas distinguished from each other on the display surface. The display surface may include a display area DA through which the image IM is displayed and a non-display area NDA defined adjacent to the display area DA. The non-display area NDA may be called a bezel area. As an example, the display area DA may have a quadrangular shape. The non-display area NDA may surround the display area DA. In addition, according to some example embodiments, the display device DD may have a shape that is partially curved. In this case, a portion of the display area DA may have a curved shape.

Front (or upper, or first) and rear (or lower, or second) surfaces of each member of the display device DD are defined with respect to a direction in which the image IM is displayed. However, directions indicated by the first, second, and third directions DR1, DR2, and DR3 are relative to each other, and thus, the directions indicated by the first, second, and third directions DR1, DR2, and DR3 may be changed to other directions.

The display device DD according to some example embodiments of the present disclosure may sense a user input TC applied from the outside. The user input TC may include various types of external inputs, such as a touch by a portion of user's body, light, heat, or pressure. According to some example embodiments, it is assumed that the user input TC is a touch input applied to a front surface of the display device DD by a user's hand, however, this is merely an example. As described above, the user input TC may be provided in various forms. In addition, the display device DD may sense the user input applied to a side surface of a rear surface of the display device DD depending on its structure, and, it should not be particularly limited.

Figure 2A:
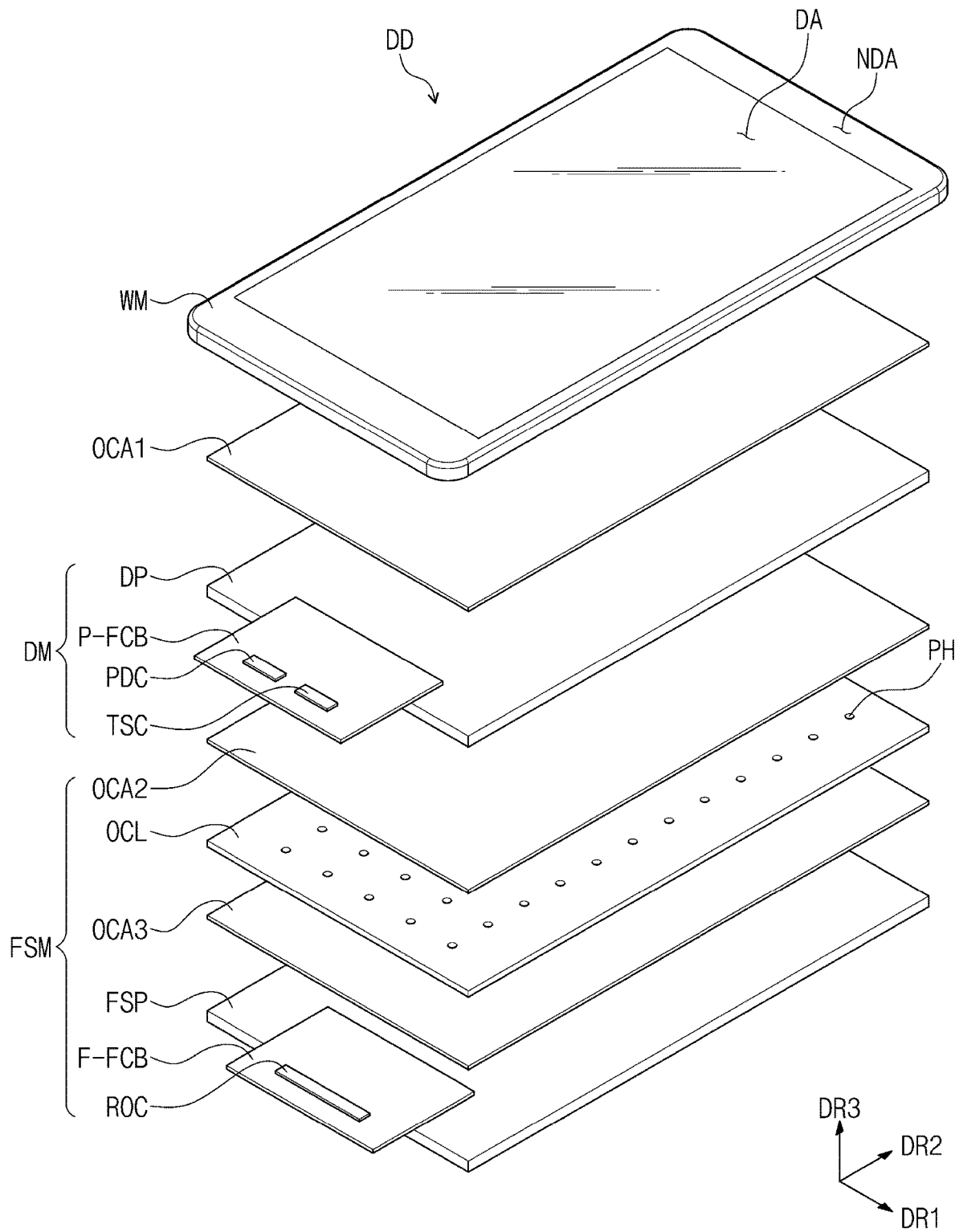
FIG. 2A is an exploded perspective view showing a display device according to some example embodiments of the present disclosure.
Figure 2B:
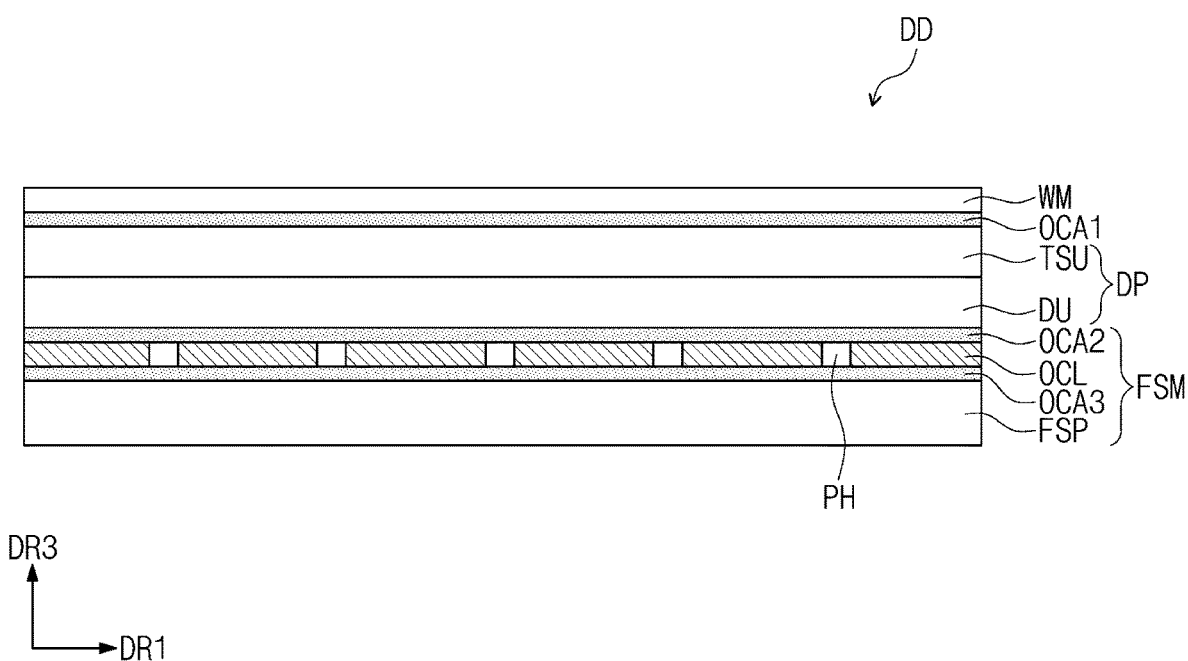
FIG. 2B is a cross-sectional view showing a display device according to some example embodiments of the present disclosure.

FIG. 2A is an exploded perspective view showing the display device DD according to some example embodiments of the present disclosure, and FIG. 2B is a cross-sectional view showing the display device DD according to some example embodiments of the present disclosure. In FIGS. 2A and 2B, components of the display device DD are schematically illustrated to show a stacking relationship therebetween.

Referring to FIGS. 2A and 2B, the display device DD may include a window member WM, a first adhesive member OCA1, a display module DM, and a fingerprint sensing module FSM. The display module DM may include a display panel DP, a panel circuit board P-FCB, a panel driving circuit PDC, and a touch sensing circuit TSC.

The window member WM may provide the front surface of the display device DD shown in FIG. 1. The window member WM may include a glass substrate, a sapphire substrate, or a plastic substrate. In addition, the window member WM may include a functional coating layer, such as an anti-fingerprint layer, an anti-reflective layer, and a hard coating layer. As an example, the window member WM has a flat shape in the display area DA, however, the shape of the window member WM may be changed. Edges of the window member WM, which face each other in the first direction DR1, may have a curved surface.

The display panel DP may be arranged on a rear surface of the window member WM and may generate the image. In addition, the display panel DP may sense the user input TC (refer to FIG. 1), e.g., an input caused by a touch and/or a pressure generated by the user. According to some example embodiments, the display panel DP has the flat display surface as a representative example, however, the shape of the display panel DP may be changed. For example, edges of the display panel DP, which face each other in the first direction DR1, may be bent to provide a curved surface.

The display panel DP may include a variety of display elements. For example, the display element may be a liquid crystal capacitor, an organic light emitting element, an inorganic light emitting element, a quantum dot element, an electrophoretic element, or an electrowetting element. The display element according to some example embodiments may include a plurality of organic light emitting diodes. That is, the display panel DP according to example embodiments of the present disclosure may be a flexible display panel, e.g., an organic light emitting display panel.

The display panel DP may include a touch sensing unit TSU and a display unit DU. According to some example embodiments, a stacking order of the touch sensing unit TSU and the display unit DU may be changed.

The first adhesive member OCA1 may be located between the window member WM and the display panel DP. The first adhesive member OCA1 may be an optically transparent adhesive member.

One end of the panel circuit board P-FCB may be bonded to pads arranged in an area of the display panel DP to be electrically connected to the display panel DP. According to some example embodiments, each of the panel driving circuit PDC and the touch sensing circuit TSC may be mounted on the panel circuit board P-FCB in a chip-on-film (COF) manner. According to some example embodiments, a plurality of passive elements and a plurality of active elements may be further mounted on the panel circuit board P-FCB. The panel circuit board P-FCB may apply electrical signals to the display panel DP via signal lines. The panel circuit board P-FCB may be implemented in a flexible printed circuit board. The other end of the panel circuit board P-FCB may be electrically connected to other components of the display device DD (refer to FIG. 1).

The fingerprint sensing module FSM may be located on a rear surface of the display panel DP and may include a second adhesive member OCA2, an optical layer OCL, a third adhesive member OCA3, a fingerprint sensing panel FSP, a fingerprint circuit board F-FCB, and a readout circuit ROC. According to some example embodiments, the fingerprint sensing module FSM is located on the rear surface of the display panel DP, however, embodiments according to the present disclosure should not be limited thereto or thereby. For example, the fingerprint sensing module FSM may be located on an upper surface of the display panel DP.

The second adhesive member OCA2 may be located between the display panel DP and the optical layer OCL to combine the display panel DP and the optical layer OCL. The third adhesive member OCA3 may be located between the optical layer OCL and the fingerprint sensing panel FSP to combine the optical layer OCL and the fingerprint sensing panel FSP. Each of the second adhesive member OCA2 and the third adhesive member OCA3 may be, but not limited to, an optically transparent adhesive member.

The optical layer OCL may include a plurality of pin holes PH defined therethrough to transmit a light reflected by a fingerprint of the user input TC (refer to FIG. 1).

In FIG. 2B, the second adhesive member OCA2 and the optical layer OCL are included in the fingerprint sensing module FSM, however, embodiments according to the present disclosure should not be limited thereto or thereby. According to some example embodiments, the second adhesive member OCA2 and the optical layer OCL may be included in the display module DM.

The fingerprint sensing panel FSP may sense an amount of light, which is reflected by the user input TC after the light exits from the display panel DP and is emitted to the outside through the window member WM, to sense fingerprint information of the user. The light reflected by the user input TC may be provided to the fingerprint sensing panel FSP through the pin holes PH of the optical layer OCL. Areas in which the pin holes PH are not formed in the optical layer OCL may be implemented with an opaque material to block the light. In addition, the optical layer OCL may be implemented with a material having a low reflectance.

One end of the fingerprint circuit board F-FCB may be bonded to pads arranged in an area of the fingerprint sensing panel FSP and may be electrically connected to the fingerprint sensing panel FSP. According to some example embodiments, the readout circuit ROC may be mounted on the fingerprint circuit board F-FCB in a chip-on-film (COF) manner. According to some example embodiments, a plurality of passive elements and a plurality of active elements may be further mounted on the fingerprint circuit board F-FCB. The fingerprint circuit board F-FCB may apply electrical signals to the fingerprint sensing panel FSP via signal lines and may receive a fingerprint sensing signal from the fingerprint sensing panel FSP. The fingerprint circuit board F-FCB may be implemented in a flexible printed circuit board. The other end of the fingerprint circuit board F-FCB may be electrically connected to other components of the display device DD.

According to some example embodiments, the panel circuit board P-FCB and the fingerprint circuit board F-FCB may be located respectively at one ends of the display panel DP and the fingerprint sensing panel FSP to face each other, however, embodiments according to the present disclosure should not be limited thereto or thereby. According to some example embodiments, the panel circuit board P-FCB and the fingerprint circuit board F-FCB may be located to be spaced apart from each other in the second direction DR2. That is, the panel circuit board P-FCB may be connected to one side of the display panel DP, and the fingerprint circuit board F-FCB may be connected to the other side of the fingerprint sensing panel FSP, which corresponds to the other side of the display panel DP.

The display device DD shown in FIG. 2A may further include a variety of elements in addition to the display module DM and the fingerprint sensing module FSM to control an operation of the display module DM and the fingerprint sensing module FSM. Circuit elements of the display device DD will be described in detail with reference to FIG. 2C.

Figure 2C:
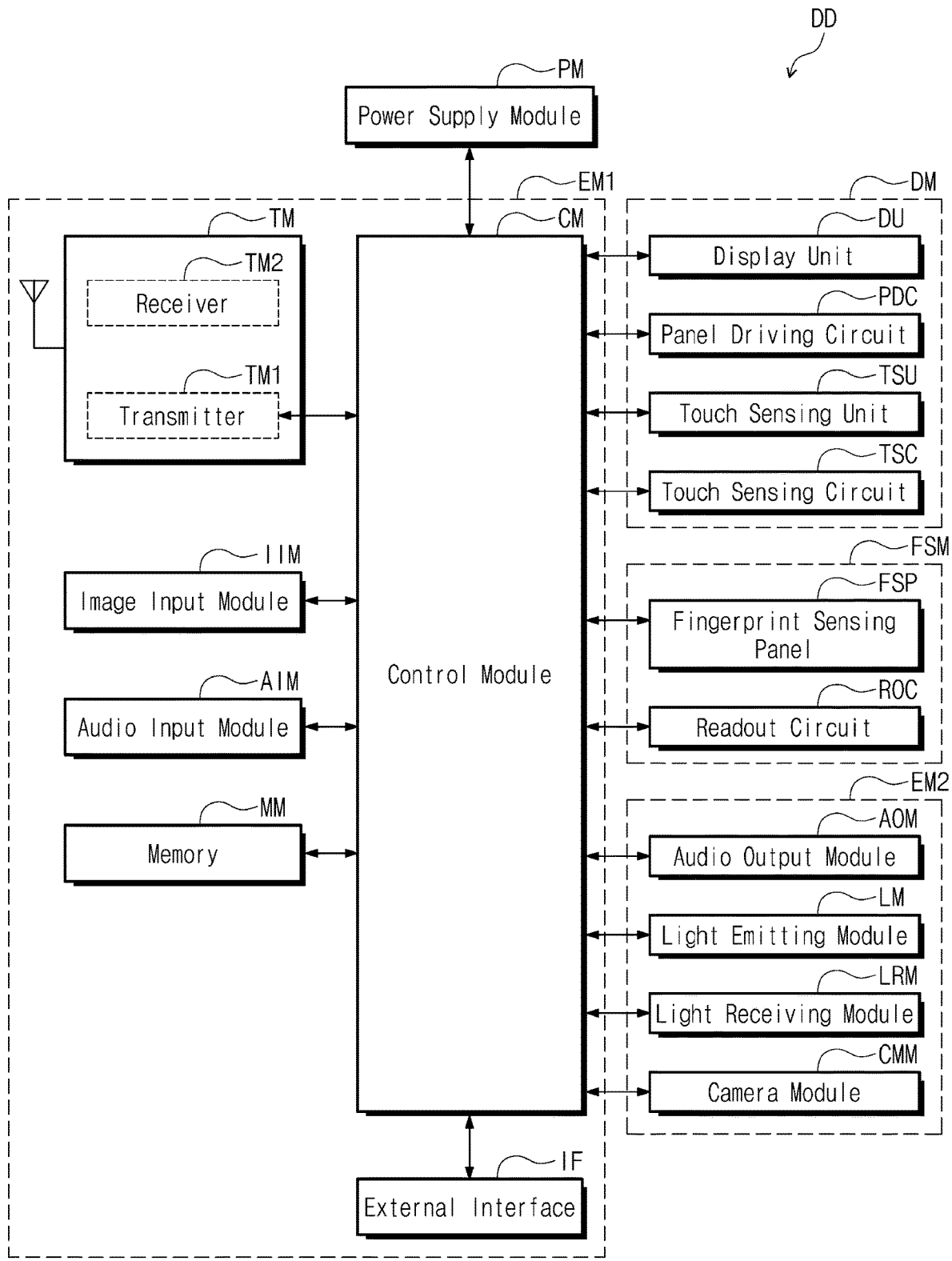
FIG. 2C is a block diagram showing a display device according to some example embodiments of the present disclosure.

FIG. 2C is a block diagram showing the display device DD shown in FIG. 1.

Referring to FIG. 2C, the display device DD may include the display module DM, a power supply module PM, a first electronic module EM1, a second electronic module EM2, and the fingerprint sensing module FSM. The display module DM, the power supply module PM, the first electronic module EM1, the second electronic module EM2, and the fingerprint sensing module FSM may be electrically connected to each other. FIG. 2C shows the display unit DU, the panel driving circuit PDC, the touch sensing unit TSU, and the touch sensing circuit TSC as representative examples of the display module DM. In addition, FIG. 2C shows the fingerprint sensing panel FSP and the readout circuit ROC as representative examples of the fingerprint sensing module FSM The power supply module PM may supply a power source necessary for an overall operation of the display device DD. The power supply module PM may include a normal battery module.

The first electronic module EM1 and the second electronic module EM2 may include a variety of functional modules to drive the display device DD. The first electronic module EM1 may be mounted directly on a mother board electrically connected to the display module DM or may be electrically connected to the mother board via a connector after being mounted on a separate substrate.

The first electronic module EM1 may include a control module CM, a wireless communication module TM, an image input module IIM, an audio input module AIM, a memory MM, and an external interface IF. Some modules among the modules may be electrically connected to the mother board through a flexible circuit board without being mounted on the mother board.

The control module CM may control an overall operation of the display device DD. The control module CM may be, but is not limited to, a microprocessor. For example, the control module CM may activate or deactivate the display module DM. The control module CM may control other modules, such as the image input module IIM or the audio input module AIM, based on the touch signal provided from the display module DM. The control module CM may perform a user authentication (fingerprint authentication) based on a fingerprint signal provided from the fingerprint sensing module FSM.

The wireless communication module TM may transmit/receive a wireless signal to/from other terminals using a Bluetooth or WiFi link. The wireless communication module TM may transmit and receive a voice signal using a general communication line. The wireless communication module TM may include a transmitter TM1 that modulates a signal to be transmitted and transmits the modulated signal and a receiver TM2 that demodulates a signal applied thereto.

The image input module IIM may process an image signal and may convert the image signal into image data that may be displayed through the display module DM. The audio input module AIM may receive an external sound signal through a microphone in a record mode or a voice recognition mode and may convert the external sound signal to electrical voice data.

The external interface IF may serve as an interface between the control module CM and external devices, such as an external charger, a wired/wireless data port, a card socket (e.g., a memory card and a SIM/UIM card), etc.

The second electronic module EM2 may include an audio output module AOM, a light emitting module LM, a light receiving module LRM, and a camera module CMM. The modules may be mounted directly on the mother board, may be electrically connected to the display module DM through a connector after being mounted on a separate substrate, or may be electrically connected to the first electronic module EM1.

The audio output module AOM may convert audio data provided from the wireless communication module TM or audio data stored in the memory MM and may output the converted audio data to the outside.

The light emitting module LM may generate a light and may output the light. The light emitting module LM may emit an infrared ray. The light emitting module LM may include an LED element. The light receiving module LRM may sense the infrared ray. The light receiving module LRM may be activated when the infrared ray having a level (e.g., a set or predetermined level) or higher is sensed. The light receiving module LRM may include a complementary metal oxide semiconductor (CMOS) sensor. The infrared ray generated by and output from the light emitting module LM may be reflected by an external object, for example, a user's finger or face, and the reflected infrared ray may be incident into the light receiving module LRM. The camera module CMM takes an image of an external object.

Figure 3A:
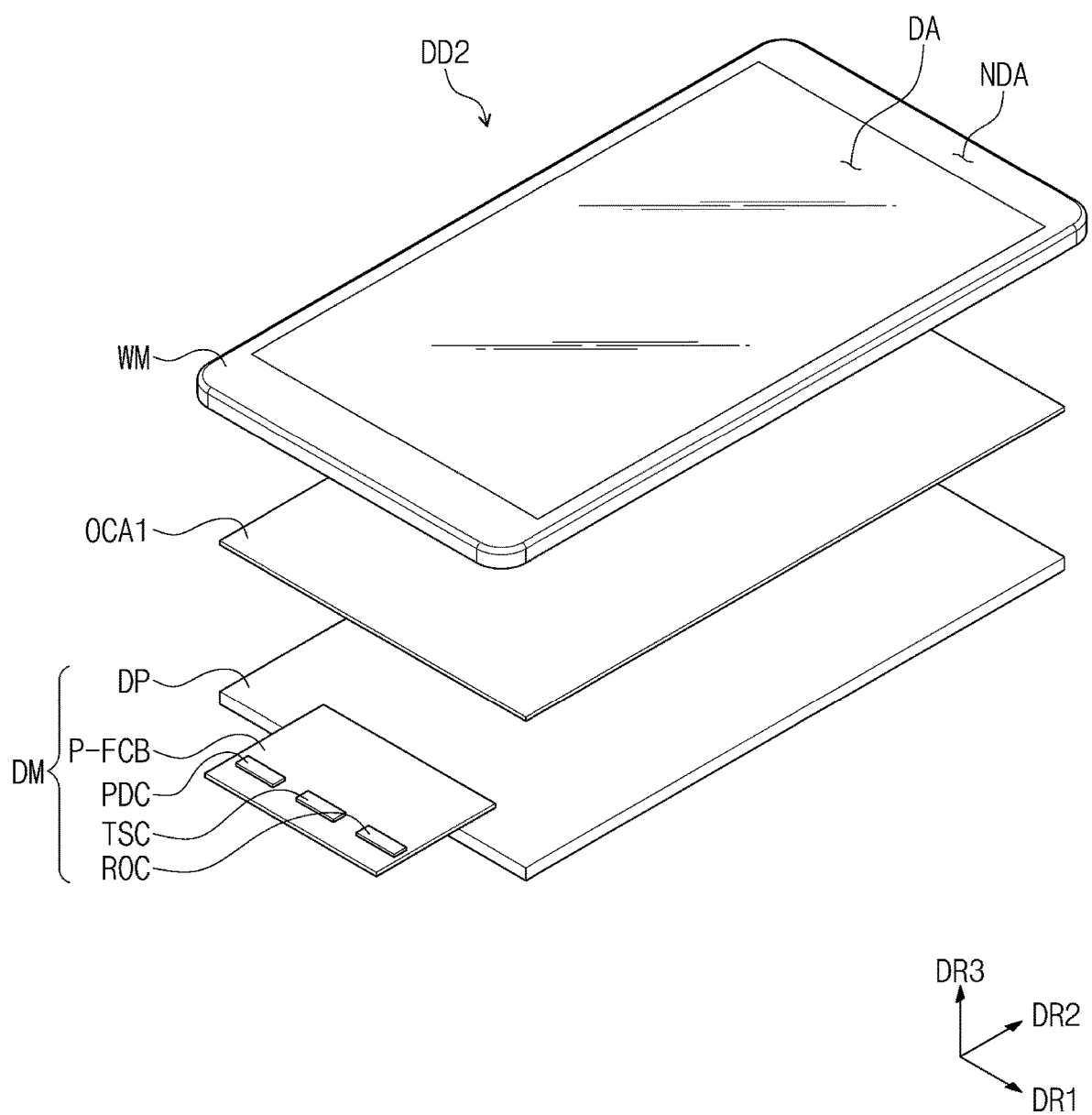
FIG. 3A is an exploded perspective view showing a display device according to some example embodiments of the present disclosure.
Figure 3B:
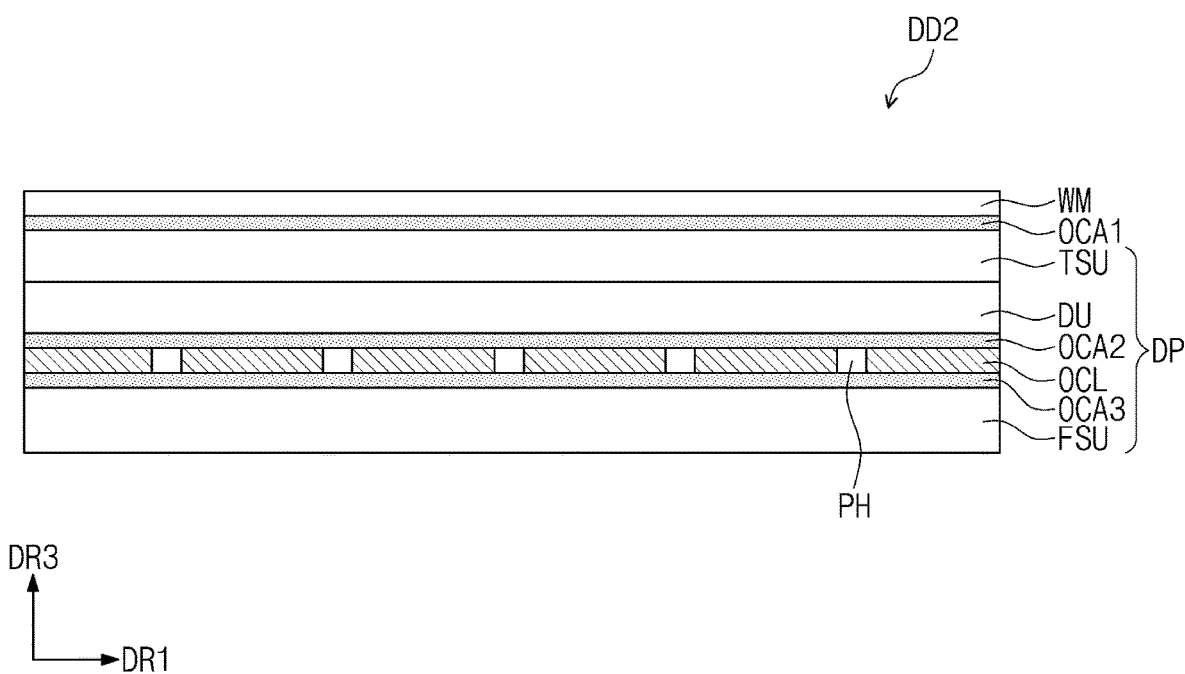
FIG. 3B is a cross-sectional view showing a display device according to some example embodiments of the present disclosure.

FIG. 3A is an exploded perspective view showing a display device DD2 according to some example embodiments of the present disclosure. FIG. 3B is a cross-sectional view showing the display device DD2 according to some example embodiments of the present disclosure. In FIGS. 3A and 3B, the same reference numerals denote the same elements in FIGS. 2A and 2B, and thus, detailed descriptions of the same elements will be omitted.

Referring to FIGS. 3A and 3B, the display device DD2 may include a window member WM, a first adhesive member OCA1, and a display module DM. The display module DM may include a display panel DP, a panel circuit board P-FCB, a panel driving circuit PDC, a touch sensing circuit TSC, and a readout circuit ROC.

The window member WM may provide a front surface of the display device DD2 shown in FIG. 3A. The first adhesive member OCA1 may be located between the window member WM and the display panel DP. The first adhesive member OCA1 may be, but not limited to, an optically transparent adhesive member.

The display panel DP may be located on a rear surface of the window member WM and may generate an image. The display panel DP may include a touch sensing unit TSU, a display unit DU, an optical layer OCL, and a fingerprint sensing unit FSU.

A second adhesive member OCA2 may be located between the display unit DU and the optical layer OCL and may combine the display unit DU and the optical layer OCL. A third adhesive member OCA3 may be located between the optical layer OCL and the fingerprint sensing unit FSU and may combine the optical layer OCL and the fingerprint sensing unit FSU. Each of the second adhesive member OCA2 and the third adhesive member OCA3 may be an optically transparent adhesive member.

According to some example embodiments, the window member WM may be a panel-type component, and each of the touch sensing unit TSU, the display unit DU, the optical layer OCL, and the fingerprint sensing unit FSU may be a layer-type component. The panel-type component may include a base layer that provides a base surface, e.g., a synthetic resin film, a composite material film, or a glass substrate, however, the base layer may be omitted in the layer-type component. In other words, layer-type components may be located on the base surface provided by other components. According to some example embodiments of the present disclosure, the window member WM may be the layer-type component.

Figure 3C:
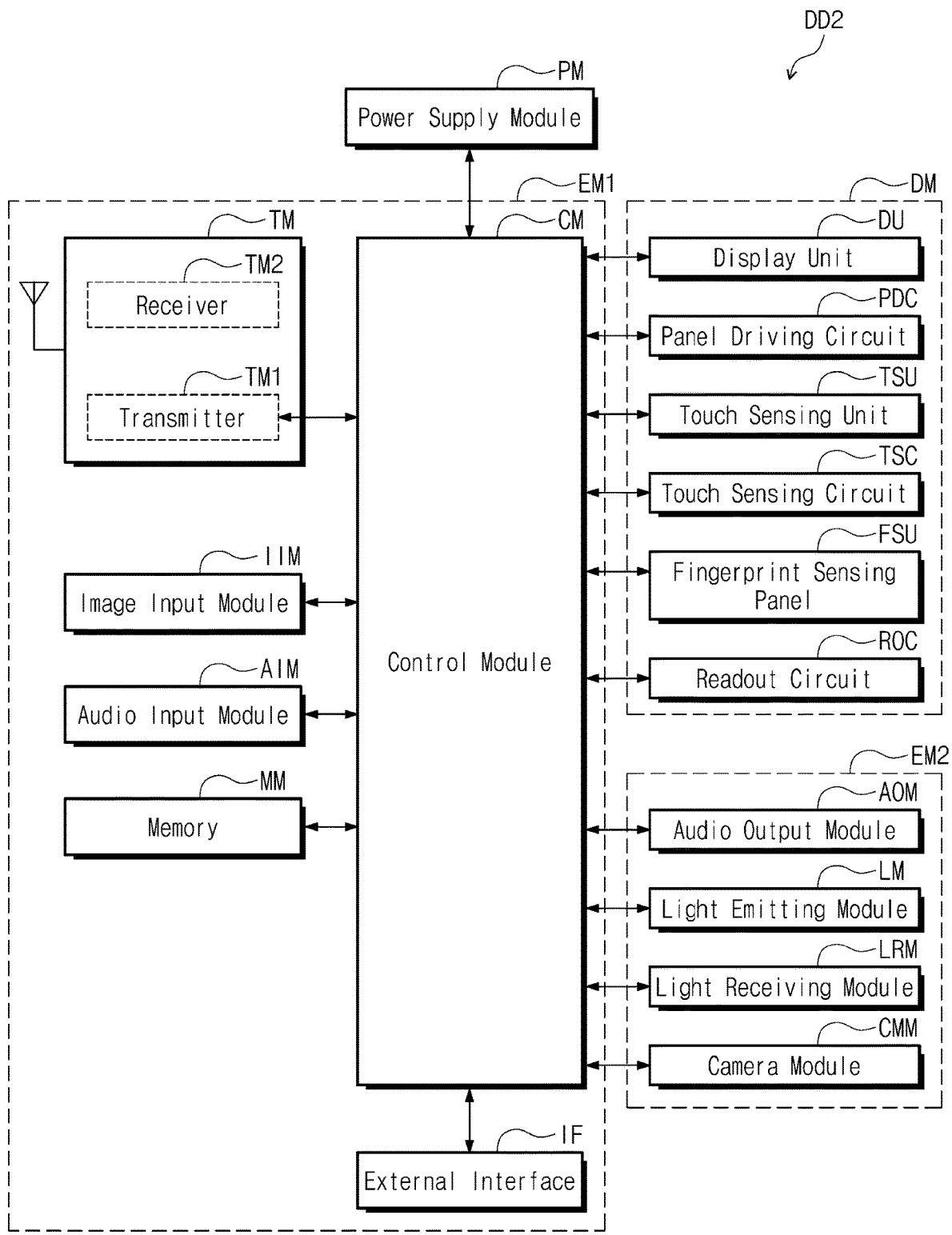
FIG. 3C is a block diagram showing a display device according to some example embodiments of the present disclosure.

FIG. 3C is a block diagram showing the display device DD2 according to some example embodiments of the present disclosure.

In FIG. 3C, the same reference numerals denote the same elements in the display device DD shown in FIG. 2C, and thus, detailed descriptions of the same elements will be omitted.

Referring to FIG. 3C, the display module DM may include the display unit DU, the panel driving circuit PDC, the touch sensing unit TSU, the touch sensing circuit TSC, the fingerprint sensing unit FSU, and the readout circuit ROC. Detailed operations of the components of the display module DM will be described in detail below.

Figure 4:
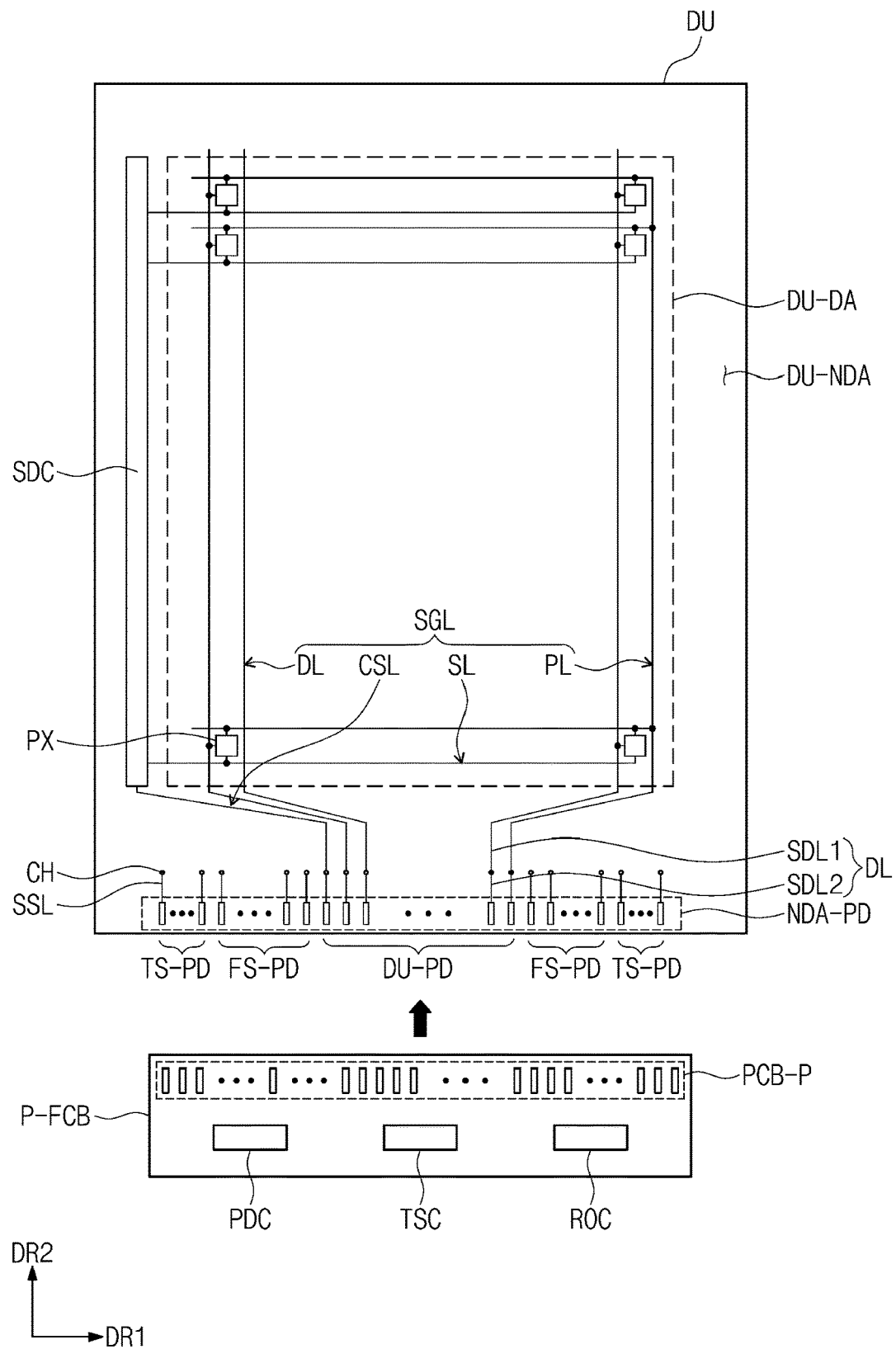
FIG. 4 is a plan view showing a display unit according to some example embodiments of the present disclosure.

FIG. 4 is a plan view showing the display unit DU according to some example embodiments of the present disclosure. FIG. 4 schematically shows a signal circuit diagram. In addition, for the convenience of explanation, some components are omitted in FIG. 4.

As shown in FIG. 4, the display unit DU may include a display area DU-DA and a non-display area DU-NDA. According to some example embodiments, the non-display area DU-NDA may be defined along an edge of the display area DU-DA. The display area DU-DA and the non-display area DU-NDA of the display unit DU may respectively correspond to the display area DA and the non-display area NDA of the display device DD shown in FIG. 1.

The display unit DU may include a scan driving circuit SDC, a plurality of signal lines SGL, a plurality of signal pads DU-PD, TS-PD, and FS-PD, and a plurality of pixels PX. The pixels PX may be arranged in the display area DU-DA. Each of the pixels PX may include an organic light emitting diode and a pixel driving circuit connected to the organic light emitting diode.

The scan driving circuit SDC may generate a plurality of scan signals and may sequentially output the scan signals to a plurality of scan lines SL described later. The scan driving circuit SDC may further output other control signals to the pixel driving circuit of the pixels PX.

The scan driving circuit SDC may include a plurality of thin film transistors formed through the same processes, for example, a low temperature polycrystalline silicon (LTPS) process or a low temperature polycrystalline oxide (LTPO) process, as the pixel driving circuit of the pixels PX.

The signal lines SGL may include the scan lines SL, data lines DL, a power line PL, and a control signal line CSL. Each of the scan lines SL may be connected to a corresponding pixel among the pixels PX, and each of the data lines DL may be connected to a corresponding pixel among the pixels PX. The power line PL may be connected to the pixels PX. The control signal line CSL may provide control signals to the scan driving circuit SDC.

The signal lines SGL may overlap the display area DU-DA and the non-display area DU-NDA. The signal lines SGL may include a pad part and a line part. The line part may overlap the display area DU-DA and the non-display area DU-NDA. The pad part may be connected to an end of the line part. The pad part may be located in the non-display area DU-NDA and may overlap a corresponding signal pad among the signal pads DU-PD, TS-PD, and FS-PD. An area in which the signal pads DU-PD, TS-PD, and FS-PD are arranged in the non-display area DU-NDA may be referred to as a "pad area NDA-PD".

According to some example embodiments, the signal lines SGL may further include auxiliary lines SSL. The auxiliary lines SSL are signal lines connected to the touch sensing unit TSU (refer to FIG. 3B). According to some example embodiments of the present disclosure, the auxiliary lines SSL may be omitted.

The signal lines SGL may include a plurality of portions located on different layers from each other. FIG. 4 shows the data lines DL each including two portions SDL1 and SDL2 and the auxiliary lines SSL. The two portions SDL1 and SDL2 may be connected to each other through contact holes CH. The auxiliary lines SSL may be connected to a signal line of the touch sensing unit TSU (refer to FIG. 5) and a signal line of the fingerprint sensing unit FSU (refer to FIG. 6) via the contact holes CH.

The signal pads DU-PD, TS-PD, and FS-PD may include first-type signal pads DU-PD connected to the data lines DL, the power line PL, and the control signal line CSL and second-type signal pads TS-PD and third-type signal pads FS-PD, which are connected to the auxiliary lines SSL. The first-type signal pads DU-PD, the second-type signal pads TS-PD, and the third-type signal pads FS-PD may be located in the pad area NDA-PD defined in some areas of the non-display area DU-NDA to be adjacent to each other. The stacked structure or materials of the signal pads DP-PD, TS-PD, and FS-PD may not be distinguished from each other and may be formed through the same process.

The line part connected to the pixel PX may substantially form a great part of the signal lines SGL. The line part may be connected to the transistors of the pixels PX. The line part may have a single-layer or multi-layer structure and may be formed in a single body or may include two or more portions. The two or more portions may be located on different layers and may be connected to each other through contact holes defined through an insulating layer located between the two or more portions.

In FIG. 4, the panel circuit board P-FCB electrically connected to the display unit DU is additionally shown. The panel circuit board P-FCB may be a rigid circuit board or a flexible circuit board. The panel circuit board P-FCB may be directly combined with the display unit DU or may be connected to the display unit DU through another circuit board.

The panel driving circuit PDC may be located on the panel circuit board P-FCB to control the operation of the display unit DU. In addition, the touch sensing circuit TSC that controls the touch sensing unit TSU may be located on the panel circuit board P-FCB. The readout circuit ROC that controls the fingerprint sensing unit FSU may be located on the panel circuit board P-FCB. Each of the panel driving circuit PDC, the touch sensing circuit TSC, and the readout circuit ROC may be mounted directly on the panel circuit board P-FCB in the form of an integrated chip. The panel circuit board P-FCB may include circuit board pads PCB-P electrically connected to the display unit DU. According to some example embodiments, the panel circuit board P-FCB may further include signal lines connecting the circuit board pads PCB-P to the panel driving circuit PDC, the touch sensing circuit TSC, and/or the readout circuit ROC.

Figure 5:
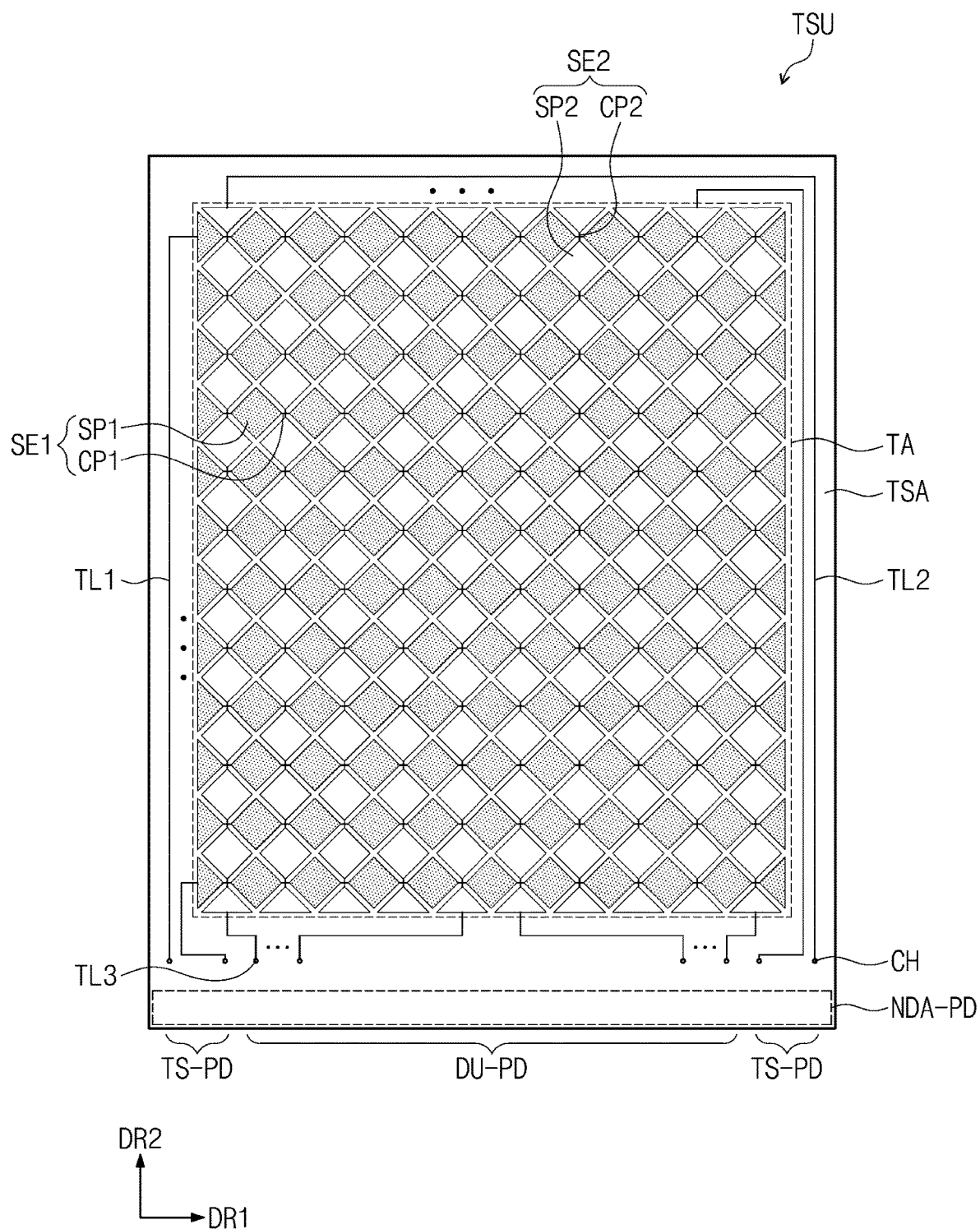
FIG. 5 is a plan view showing a touch sensing unit according to some example embodiments of the present disclosure.

FIG. 5 is a plan view showing the touch sensing unit TSU according to some example embodiments of the present disclosure.

Referring to FIG. 5, the touch sensing unit TSU may be located on the display unit DU (refer to FIG. 4). The touch sensing unit TSU may sense the user input TC (refer to FIG. 1) and may obtain information about position and intensity of the external touch input. The touch sensing unit TSU may include a touch area TA and a touch peripheral area TSA in a plane. According to some example embodiments, the touch peripheral area TSA may be defined along an edge of the touch area TA. The touch area TA and the touch peripheral area TSA of the touch sensing unit TSU may respectively correspond to the display area DA and the non-display area NDA of the display device DD shown in FIG. 1.

The touch sensing unit TSU may include a plurality of first sensing electrodes SE1, a plurality of second sensing electrodes SE2, and a plurality of sensing lines TL1, TL2, and TL3.

The first sensing electrodes SE1 and the second sensing electrodes SE2 may be arranged in the touch area TA. The touch sensing unit TSU may obtain information about the touch input depending on a variation in capacitance between the first sensing electrodes SE1 and the second sensing electrodes SE2.

The first sensing electrodes SE1 may extend in the first direction DR1 and may be arranged in the second direction DR2. The first sensing electrodes SE1 may include a plurality of first sensing patterns SP1 and a plurality of first auxiliary patterns CP1.

The first sensing patterns SP1 that form one first sensing electrode may be arranged in the first direction DR1 to be spaced apart from each other. For the convenience of explanation, the first sensing patterns SP1 are shown shaded. The first auxiliary patterns CP1 may be located between the first sensing patterns SP1 and may connect two first sensing patterns SP1 adjacent to each other.

The second sensing electrodes SE2 may extend in the second direction DR2 and may be arranged in the first direction DR1. The second sensing electrodes SE2 may include a plurality of second sensing patterns SP2 and a plurality of second auxiliary patterns CP2.

The second sensing patterns SP2 that form one second sensing electrode may be arranged in the second direction DR2 to be spaced apart from each other. The second auxiliary patterns CP2 may be located between the second sensing patterns SP2 and may connect two second sensing patterns SP2 adjacent to each other.

The sensing lines TL1, TL2, and TL3 may be located in the touch peripheral area TSA. The sensing lines TL1, TL2, and TL3 may include first sensing lines TL1, second sensing lines TL2, and third sensing lines TL3. The first sensing lines TL1 may be respectively connected to the first sensing electrodes SE1. The second sensing lines TL2 may be respectively connected to one ends of the second sensing electrodes SE2. The third sensing lines TL3 may be respectively connected to the other ends of the second sensing electrodes SE2. The other ends of the second sensing electrodes SE2 may be portions opposite to the one ends of the second sensing electrodes SE2. Accordingly, it may be possible to relatively uniformly maintain a sensitivity with respect to areas of the second sensing electrode SE2 having a relatively longer length than that of the first sensing electrode SE1. According to some example embodiments, one of the second sensing lines TL2 and the third sensing lines TL3 may be omitted. The first sensing lines TL1, the second sensing lines TL2, and the third sensing lines TL3 may be connected to a portion of the auxiliary lines SSL shown in FIG. 4 through contact holes CH. The first sensing lines TL1 and the second sensing lines TL2 may be electrically connected to the second-type signal pads TS-PD through the auxiliary lines SSL.

Figure 6:
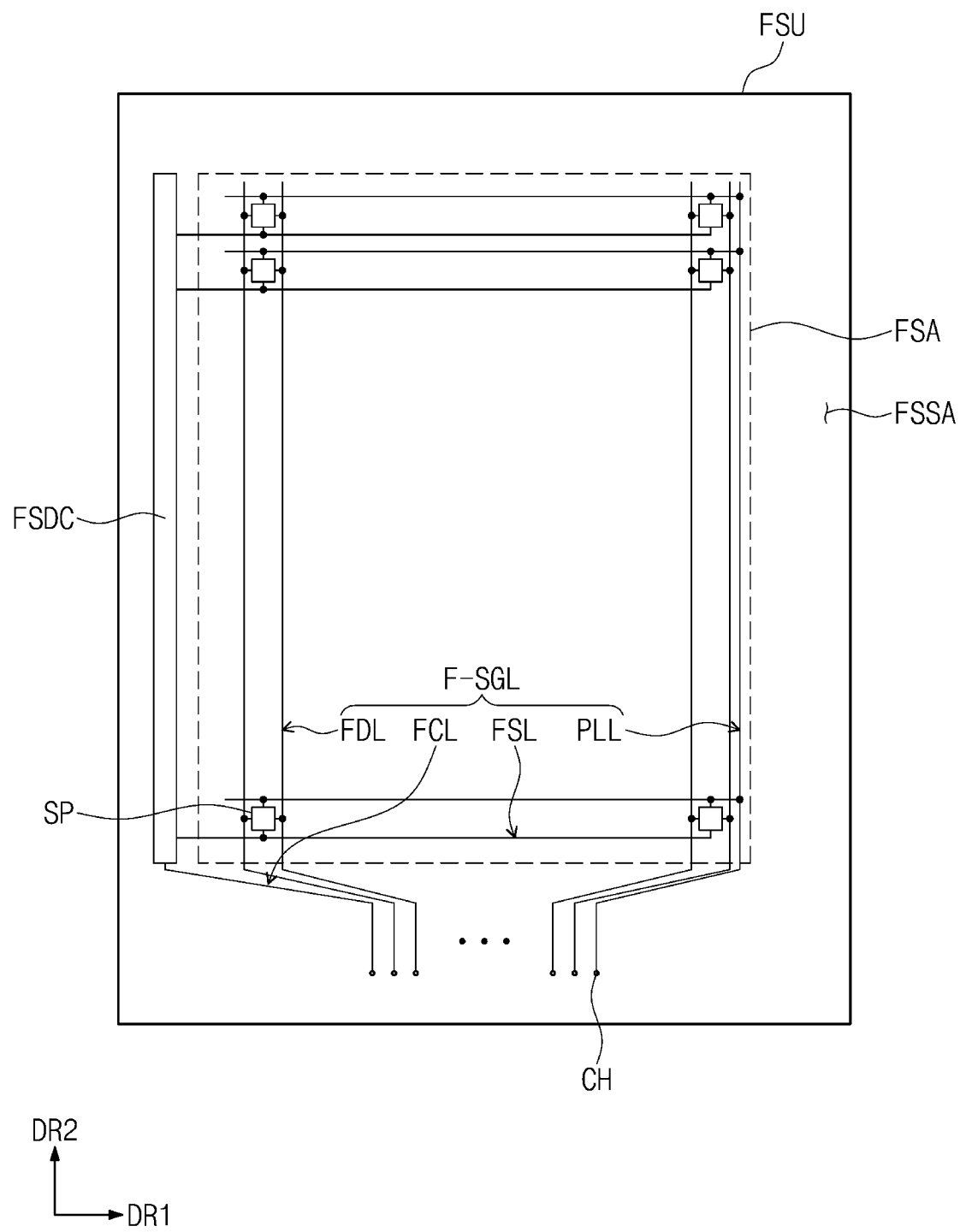
FIG. 6 is a plan view showing a fingerprint sensing unit according to some example embodiments of the present disclosure.

FIG. 6 is a plan view showing the fingerprint sensing unit FSU according to some example embodiments of the present disclosure.

Referring to FIG. 6, the fingerprint sensing unit FSU may sense the light reflected by the user input TC (refer to FIG. 1) and may obtain user's fingerprint information. The fingerprint sensing unit FSU may include a fingerprint sensing area FSA and a peripheral area FSSA in a plan view. According to some example embodiments, the peripheral area FSSA may be defined along an edge of the fingerprint sensing area FSA. The fingerprint sensing area FSA and the peripheral area FSSA of the fingerprint sensing unit FSU may respectively correspond to the display area DA and the non-display area NDA of the display device DD shown in FIG. 1. Therefore, the display area DA of the display device DD shown in FIG. 1, the display area DU-DA of the display unit DU shown in FIG. 4, the touch area TA of the touch sensing unit TSU shown in FIG. 5, and the fingerprint sensing area FSA of the fingerprint sensing unit FSU may correspond to each other. Similarly, the non-display area NDA of the display device DD shown in FIG. 1, the non-display area DU-NDA of the display unit DU shown in FIG. 4, the touch peripheral area TSA of the touch sensing unit TSU shown in FIG. 5, and the peripheral area FSSA of the fingerprint sensing unit FSU may correspond to each other. However, the present disclosure should not be limited thereto or thereby. For example, the fingerprint sensing area FSA of the fingerprint sensing unit FSU may correspond to a portion of the display area DA of the display device DD shown in FIG. 1. That is, the fingerprint sensing area FSA of the fingerprint sensing unit FSU may have a size smaller than that of the display area DA of the display device DD.

The fingerprint sensing unit FSU may include a fingerprint scan driving circuit FSDC, a plurality of fingerprint signal lines F-SGL, and a plurality of fingerprint sensing pixels SP. The fingerprint sensing pixels SP may be located in the fingerprint sensing area FSA.

The fingerprint scan driving circuit FSDC may generate a plurality of fingerprint scan signals and may sequentially output the fingerprint scan signals to a plurality of fingerprint scan lines FSL described later. The fingerprint scan driving circuit FSDC may further output other control signals to the fingerprint sensing pixels SP.

According to some example embodiments of the present disclosure, the fingerprint sensing unit FSU may include only the fingerprint scan driving circuit FSDC located at one side of the fingerprint sensing area FSA, however, according to some example embodiments, the fingerprint sensing unit FSU may include at least two fingerprint scan driving circuits. The two fingerprint scan driving circuits may be located to face each other with the fingerprint sensing area FSA interposed therebetween, and the fingerprint scan lines FSL may be commonly connected to the two fingerprint scan driving circuits.

The fingerprint signal lines F-SGL may include the fingerprint scan lines FSL, fingerprint sensing lines FDL, a control signal line FCL, and a fingerprint power line PLL. The fingerprint scan lines FSL may be connected to corresponding fingerprint sensing pixels SP, respectively, and the fingerprint sensing lines FDL may be connected to corresponding fingerprint sensing pixels SP, respectively. FIG. 6 shows one fingerprint power line PLL, however, each of the fingerprint sensing pixels SP may be connected to two or more fingerprint power lines. The control signal line FCL may provide control signals to the fingerprint scan driving circuit FSDC.

The fingerprint signal lines F-SGL may overlap the fingerprint sensing area FSA and the peripheral area FSSA. The fingerprint signal lines F-SGL may be connected to some of the auxiliary lines SSL shown in FIG. 4 through the contact holes CH. The fingerprint signal lines F-SGL may be electrically connected to the third-type signal pads FS-PD through the auxiliary lines SSL.

According to some example embodiments, the fingerprint scan driving circuit FSDC may be formed on the same substrate as the fingerprint sensing pixels SP, however, embodiments according to the present disclosure should not be limited thereto or thereby. For example, the fingerprint scan driving circuit FSDC may be implemented in an independent integrated circuit chip and may be electrically connected to at least one side of the fingerprint sensing unit FSU. In addition, according to some example embodiments, the fingerprint scan driving circuit FSDC may be provided in the readout circuit ROC and may provide the fingerprint scan signals to the fingerprint scan lines FSL through connection lines.

Figure 7:
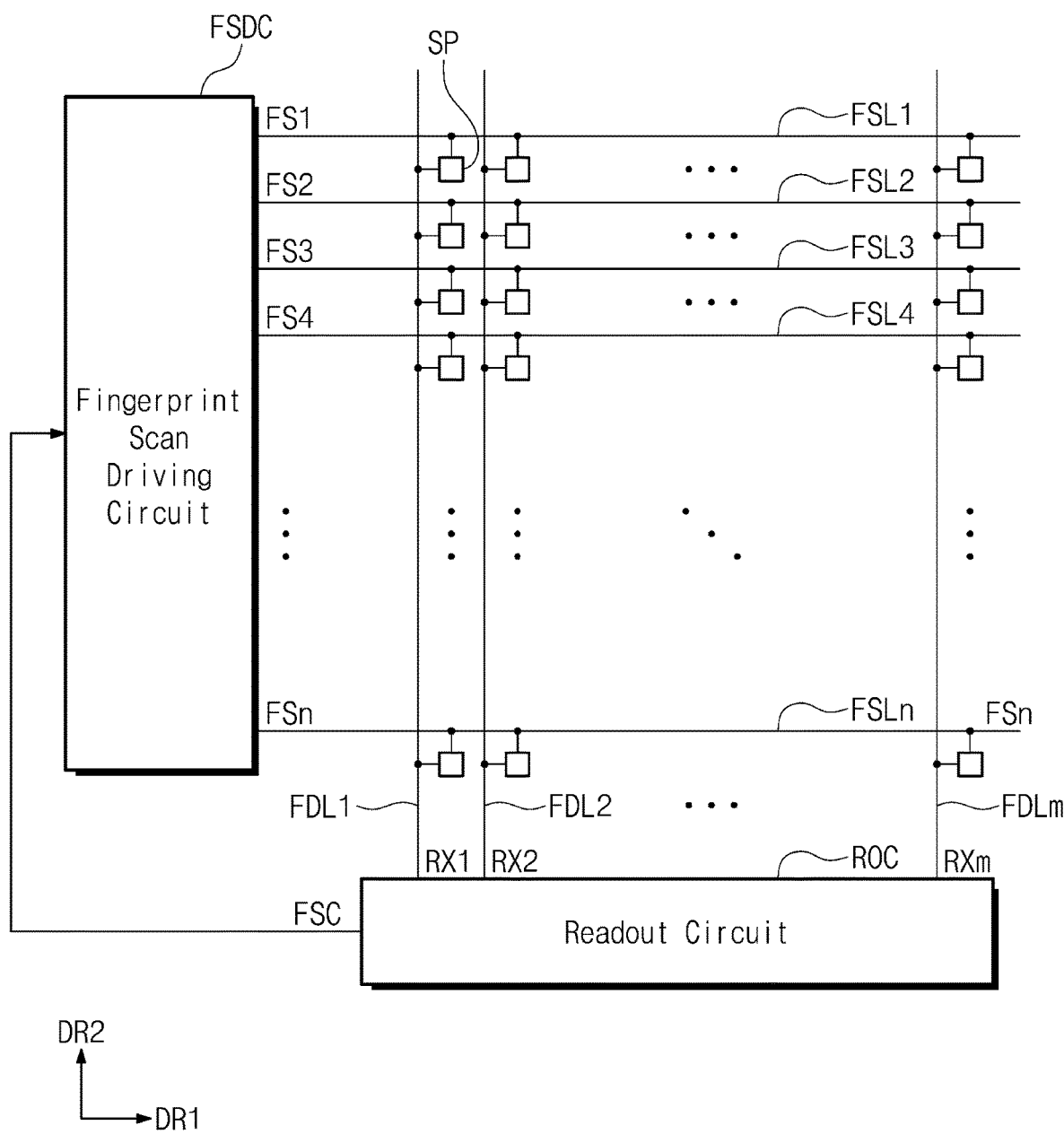
FIG. 7 is a view showing a connection relationship between fingerprint sensing pixels and a fingerprint scan driving circuit and between the fingerprint sensing pixels and a readout circuit according to some example embodiments of the present disclosure.

FIG. 7 is a view showing a connection relationship between fingerprint sensing pixels and a fingerprint scan driving circuit and between the fingerprint sensing pixels and a readout circuit.

Referring to FIG. 7, each of the fingerprint sensing pixels SP may be connected to a corresponding fingerprint sensing line among a plurality of fingerprint sensing lines FDL1 to FDLm and a corresponding fingerprint scan line among a plurality of fingerprint scan lines FSL1 to FSLn.

The fingerprint scan driving circuit FSDC may output fingerprint scan signals FS1 to FSn to the fingerprint scan lines FSL1 to FSLn in response to a fingerprint sensing control signal FSC. The fingerprint sensing control signal FSC may be provided from the readout circuit ROC.

The readout circuit ROC may provide the fingerprint sensing control signal FSC to the fingerprint scan driving circuit FSDC. The readout circuit ROC may further provide other signals needed for an operation of the fingerprint scan driving circuit FSDC in addition to the fingerprint sensing control signal FSC. In addition, the readout circuit ROC may receive fingerprint sensing signals RX1 to RXm from the fingerprint sensing lines FDL1 to FDLm.

Because a user's fingerprint in a normal skin state has clear features, it is easy to identify a shape of the fingerprint when the fingerprint sensing unit FSU senses the user's fingerprint, however, the user's fingerprint in a dry skin state has features that are unclear, and thus, it is difficult to identify the shape of the fingerprint.

For example, the user may register the fingerprint in the normal skin state on the display device DD (refer to FIG. 1) in a fingerprint registration mode. Then, when the user inputs the fingerprint in the dry skin state in a fingerprint authentication mode, the user authentication (fingerprint authentication) may fail because the features in the dry skin state are different from the features in the normal skin state. In addition, the features of the user's fingerprint may not be accurately transmitted to the fingerprint sensing panel FSP in a low temperature environment with low ambient temperature.

Figure 8:
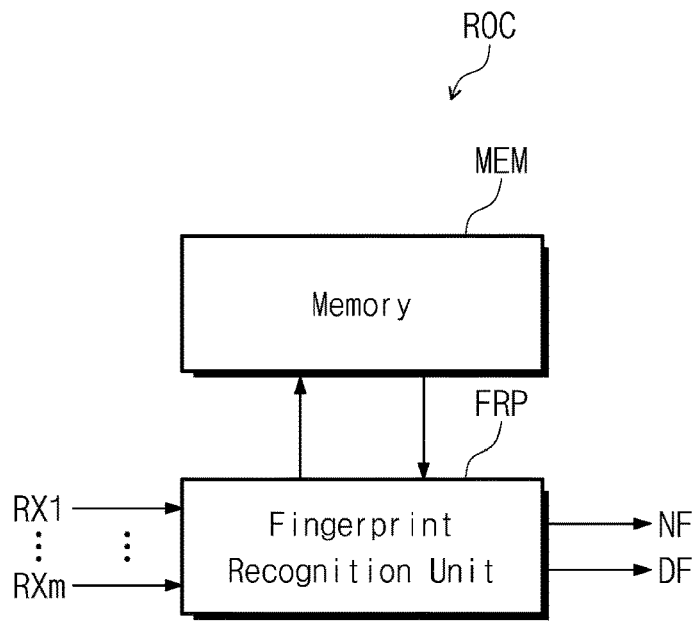
FIG. 8 is a block diagram showing the readout circuit according to some example embodiments of the present disclosure.

FIG. 8 is a block diagram showing the readout circuit ROC according to some example embodiments of the present disclosure.

Referring to FIG. 8, the readout circuit ROC may include a fingerprint recognition unit FRP and a memory MEM.

The fingerprint recognition unit FRP may receive the fingerprint sensing signals RX1 to RXm and may output a normal fingerprint image NF and a dry fingerprint image DF. The fingerprint recognition unit FRP may generate the normal fingerprint image NF and the dry fingerprint image DF corresponding to the fingerprint sensing signals RX1 to RXm according to a fingerprint recognition algorithm.

The memory MEM may store the fingerprint recognition algorithm performed by the fingerprint recognition unit FRP. The fingerprint recognition algorithm may be an artificial intelligence program or software learned by deep learning.

The fingerprint recognition unit FRP may be operated in the fingerprint registration mode and the fingerprint authentication mode. The fingerprint recognition unit FRP may generate the normal fingerprint image NF and the dry fingerprint image DF corresponding to the fingerprint sensing signals RX1 to RXm during the fingerprint registration mode. The fingerprint recognition unit FRP may first generate the normal fingerprint image NF corresponding to the fingerprint sensing signals RX1 to RXm and may store the generated normal fingerprint image NF in the memory MEM. The fingerprint recognition unit FRP may generate the dry fingerprint image DF based on the generated normal fingerprint image NF. The fingerprint recognition unit FRP may compare the normal fingerprint image NF stored in the memory MEM with the dry fingerprint image DF and may output the dry fingerprint image DF when a matching score of the normal fingerprint image NF and the dry fingerprint image DF is greater than a reference score. The fingerprint recognition unit FRP may store the dry fingerprint image DF in the memory MEM.

The fingerprint recognition unit FRP may store a normal fingerprint template corresponding to the normal fingerprint image NF and a dry fingerprint template corresponding to the dry fingerprint image DF in the memory MEM. The normal fingerprint template may include attribute information of feature points included in the normal fingerprint image NF, and the dry fingerprint template may include attribute information of feature points included in the dry fingerprint image DF. The attribute information of the feature points may include a position of the feature point, an angle of the feature point, a reliability of the feature point, a curvature around the feature point, and a ridge thickness around feature points.

The normal fingerprint image NF and the dry fingerprint image DF, which are output from the fingerprint recognition unit FRP, may be provided to the control module CM shown in FIG. 2C or to the control module CM shown in FIG. 3C.

The fingerprint recognition unit FRP may generate the fingerprint image corresponding to the fingerprint sensing signals RX1 to RXm during the fingerprint authentication mode. The fingerprint recognition unit FRP may compare the fingerprint image generated by the fingerprint sensing signals RX1 to RXm with the normal fingerprint template and the dry fingerprint template stored in the memory MEM to perform the user authentication (fingerprint authentication).

According to some example embodiments, the fingerprint recognition unit FRP may output the fingerprint image corresponding to the fingerprint sensing signals RX1 to RXm as one of the normal fingerprint image NF and the dry fingerprint image DF during the fingerprint authentication mode. For example, when the fingerprint image corresponding to the fingerprint sensing signals RX1 to RXm sufficiently includes the feature points, the fingerprint image corresponding to the fingerprint sensing signals RX1 to RXm may be output as the normal fingerprint image NF. The fingerprint recognition unit FRP may compare the normal fingerprint image NF with the normal fingerprint template and the dry fingerprint template stored in the memory MEM and may perform the user authentication (fingerprint authentication) based on the compared results.

Meanwhile, when the fingerprint image corresponding to the fingerprint sensing signals RX1 to RXm does not sufficiently include the feature points, the fingerprint image corresponding to the fingerprint sensing signals RX1 to RXm may be output as the dry fingerprint image DF. The fingerprint recognition unit FRP may convert the dry fingerprint image DF to the normal fingerprint image NF, may compare the converted normal fingerprint image NF with the normal fingerprint template and the dry fingerprint template stored in the memory MEM, and may perform the user authentication (fingerprint authentication) based on the compared results.

According to some example embodiments, the fingerprint recognition unit FRP may output the fingerprint image corresponding to the fingerprint sensing signals RX1 to RXm as the normal fingerprint image NF during the fingerprint authentication mode. The control module CM shown in FIG. 2C or the control module CM shown in FIG. 3C may perform the user authentication (fingerprint authentication) using the normal fingerprint image NF applied thereto from the fingerprint recognition unit FRP.

Figure 9:
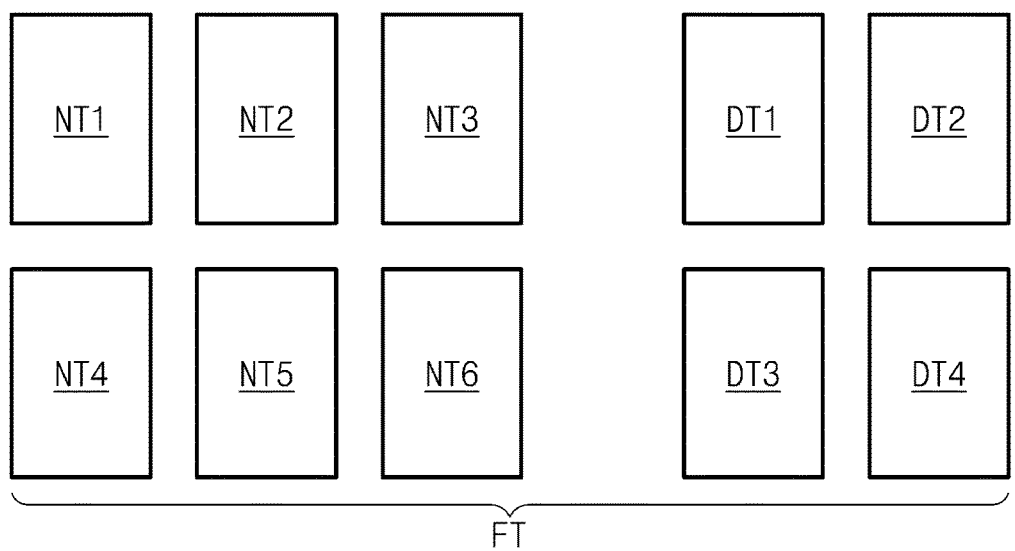
FIG. 9 is a view showing a normal fingerprint template and a dry fingerprint template according to some example embodiments of the present disclosure.

FIG. 9 is a view showing the normal fingerprint template and the dry fingerprint template.

Referring to FIGS. 8 and 9, the fingerprint recognition unit FRP may generate the normal fingerprint image NF corresponding to the fingerprint sensing signals RX1 to RXm during the fingerprint registration mode and may store the normal fingerprint template corresponding to the normal fingerprint image NF in the memory MEM. For example, when the display device DD (refer to FIG. 1) is set to receive the user's fingerprint six times, the fingerprint recognition unit FRP may sequentially receive the fingerprint sensing signals RX1 to RXm six times and may generate six normal fingerprint images NF respectively corresponding to the fingerprint sensing signals RX1 to RXm that are input thereto six times. The fingerprint recognition unit FRP may sequentially store six normal fingerprint templates NT1 to NT6 respectively corresponding to the six normal fingerprint images NF in the memory MEM. In addition, the fingerprint recognition unit FRP may sequentially store four dry fingerprint templates DT1 to DT4 respectively corresponding to four normal fingerprint images NF among the six normal fingerprint images NF in the memory MEM. Consequently, a fingerprint template FT may include the six normal fingerprint templates NT1 to NT6 and the four dry fingerprint templates DT1 to DT4.

The number of the normal fingerprint templates NT1 to NT6 and the number of the dry fingerprint templates DT1 to DT4, which are stored in the memory MEM, may be changed in various ways. For example, the number of the normal fingerprint templates NT1 to NT6 and the number of the dry fingerprint templates DT1 to DT4, which are stored in the memory MEM, may be equal to each other.

In addition, the normal fingerprint templates NT1 to NT6 and the dry fingerprint templates DT1 to DT4 may be stored in the memory MEM of the readout circuit ROC. According to some example embodiments, the fingerprint recognition unit FRP may provide the normal fingerprint templates NT1 to NT6 and the dry fingerprint templates DT1 to DT4 to the control module CM shown in FIG. 2C or 3C. The control module CM may store the normal fingerprint templates NT1 to NT6 and the dry fingerprint templates DT1 to DT4 in the memory MM shown in FIG. 2C or 3C.

Figure 10:
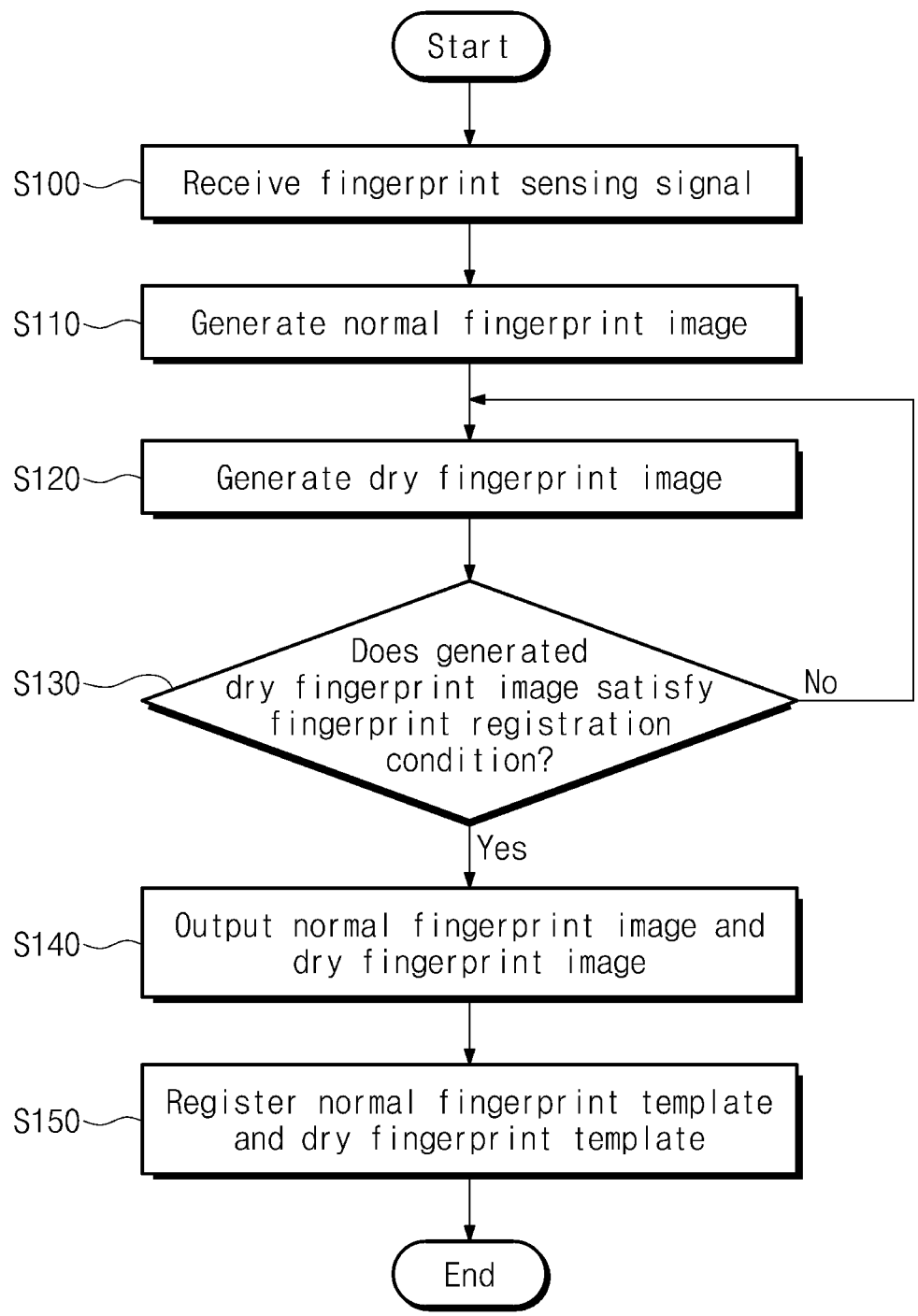
FIG. 10 is a flowchart showing an operation of the display device in a fingerprint registration mode according to some example embodiments of the present disclosure.

FIG. 10 is a flowchart showing an operation of the display device in the fingerprint registration mode according to some example embodiments of the present disclosure. For the convenience of explanation, the operation of the display device in the fingerprint registration mode will be described as being performed in the readout circuit ROC shown in FIG. 8, however, the present disclosure should not be limited thereto or thereby. The fingerprint registration mode of the display device may be performed by the control module CM shown in FIG. 2C or 3C.

Referring to FIG. 10, the fingerprint recognition unit FRP receives the fingerprint sensing signals RX1 to RXm from the fingerprint sensing pixels SP of the fingerprint sensing unit FSU shown in FIG. 7 (S100).

The fingerprint recognition unit FRP generates the normal fingerprint image NF corresponding to the fingerprint sensing signals RX1 to RXm (S110).

The fingerprint recognition unit FRP generates the dry fingerprint image DF corresponding to the fingerprint sensing signals RX1 to RXm (S120). The fingerprint recognition unit FRP generates the dry fingerprint image based on the normal fingerprint image NF. The dry fingerprint image generated by the fingerprint recognition unit FRP is a virtual fingerprint image generated by predicting a fingerprint image input when a user's skin is in a dry state based on the fingerprint sensing signals RX1 to RXm.

The fingerprint recognition unit FRP determines whether the generated dry fingerprint image satisfies the fingerprint registration condition (S130). For example, when the matching score between the generated dry fingerprint image and the normal fingerprint image NF is greater than the reference score, the fingerprint recognition unit FRP outputs the generated dry fingerprint image as the dry fingerprint image DF. The matching score is a score that indicates the degree of matching between the generated dry fingerprint image and the normal fingerprint image NF.

When the generated dry fingerprint image satisfies the fingerprint registration condition, i.e., when the matching score is greater than the reference score, the fingerprint recognition unit FRP outputs the normal fingerprint image NF and the dry fingerprint image DF (S140). The normal fingerprint image NF and the dry fingerprint image DF are provided to the control module CM shown in FIG. 2C or 3C.

When the generated dry fingerprint image does not satisfy the fingerprint registration condition, i.e., when the matching score is equal to or smaller than the reference score, the fingerprint recognition unit FRP repeatedly performs the operation (S120) to generate a new dry fingerprint image based on the fingerprint sensing signals RX1 to RXm.

According to some example embodiments, when the number of times that the generated dry fingerprint image does not satisfy the fingerprint registration condition is equal to k times (k is a natural number), the fingerprint recognition unit FRP may not generate the dry fingerprint image DF. As described with reference to FIG. 9, when the four dry fingerprint templates DT1 to DT4 respectively corresponding to the four normal fingerprint images NF among the six normal fingerprint images NF are generated, the fingerprint recognition unit FRP may not generate the dry fingerprint image DF corresponding to the fingerprint sensing signals RX1 to RXm that are currently received.

The fingerprint recognition unit FRP stores (registers) the normal fingerprint template corresponding to the normal fingerprint image NF and the dry fingerprint template corresponding to the dry fingerprint image DF in the memory MEM (S150). The fingerprint recognition unit FRP provides the normal fingerprint template and the dry fingerprint template to the control module CM shown in FIG. 2C or 3C.

Figure 11:
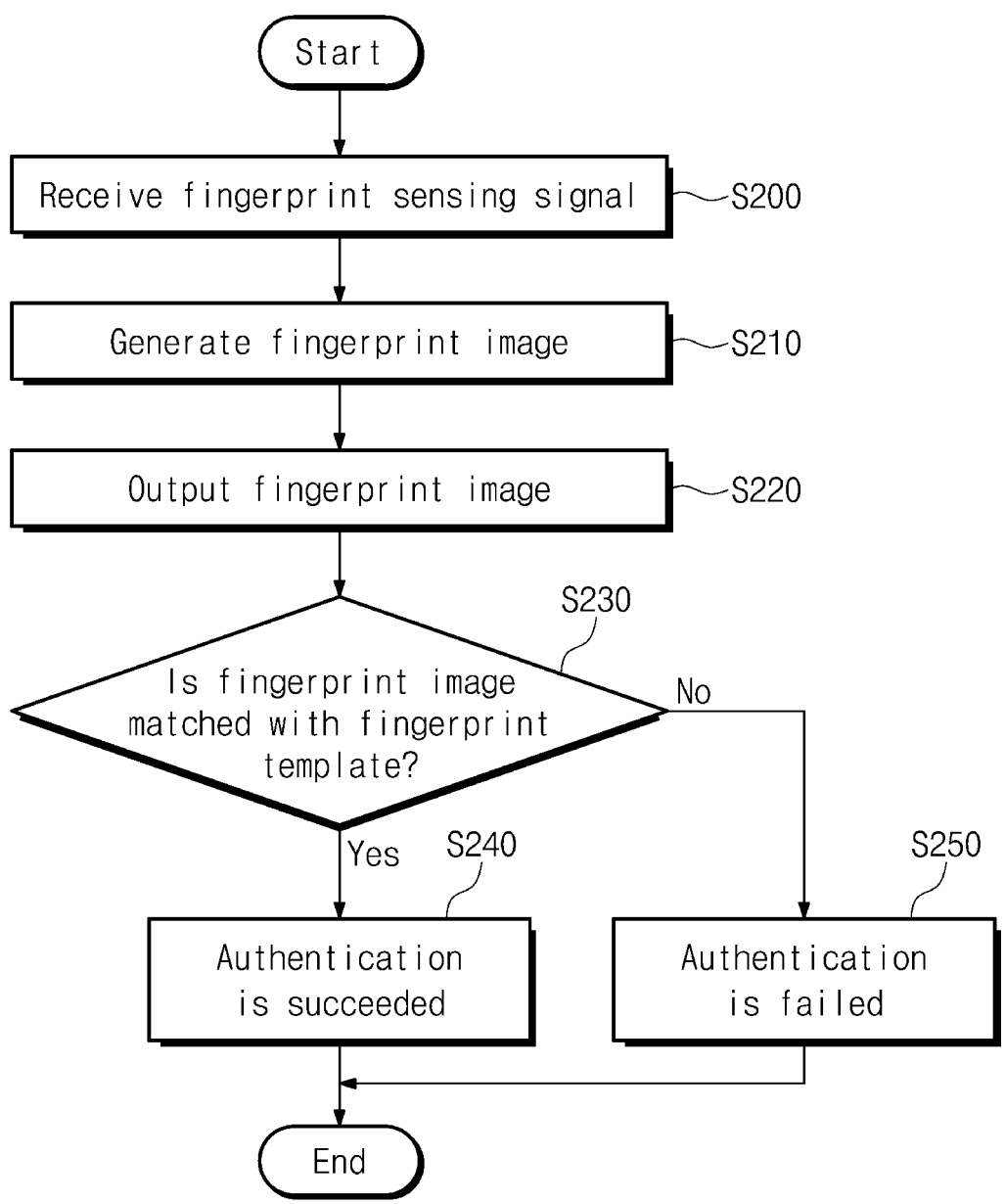
FIG. 11 is a flowchart showing an operation of the display device in a fingerprint authentication mode according to some example embodiments of the present disclosure.

FIG. 11 is a flowchart showing an operation of the display device in the fingerprint authentication mode according to some example embodiments of the present disclosure. For the convenience of explanation, the operation of the display device in the fingerprint authentication mode will be described as being performed in the readout circuit ROC shown in FIG. 8, however, the present disclosure should not be limited thereto or thereby. The fingerprint authentication mode of the display device may be performed by the control module CM shown in FIG. 2C or 3C.

Referring to FIG. 11, the fingerprint recognition unit FRP receives the fingerprint sensing signals RX1 to RXm from the fingerprint sensing pixels SP of the fingerprint sensing unit FSU shown in FIG. 7 (S200).

The fingerprint recognition unit FRP generates the fingerprint image corresponding to the fingerprint sensing signals RX1 to RXm (S210).

The fingerprint recognition unit FRP outputs the generated fingerprint image as the fingerprint image (S220). As an example, the fingerprint recognition unit FRP outputs the fingerprint image as the normal fingerprint image NF.

The fingerprint recognition unit FRP determines whether the fingerprint image matches with the fingerprint template FT stored in the memory MEM (S230). The fingerprint template FT stored in the memory MEM includes the normal fingerprint templates NT1 to NT6 and the dry fingerprint templates DT1 to DT4 shown in FIG. 9.

When the fingerprint image matches with the fingerprint template FT stored in the memory MEM, the fingerprint recognition unit FRP determines that the user authentication (fingerprint authentication) is successful (S240). For example, when the fingerprint image matches with one of the normal fingerprint templates NT1 to NT6 and the dry fingerprint templates DT1 to DT4 of the fingerprint template FT, the fingerprint recognition unit FRP determines that the user authentication (fingerprint authentication) is successful. That is, when the template whose matching score with the fingerprint image is greater than the reference score exists in the normal fingerprint templates NT1 to NT6 and the dry fingerprint templates DT1 to DT4, the fingerprint recognition unit FRP determines that the user authentication (fingerprint authentication) is successful.

When the fingerprint image is not matched with the fingerprint template FT stored in the memory MEM, the fingerprint recognition unit FRP determines that the user authentication (fingerprint authentication) is failed (S250). For example, when the fingerprint image is not matched with any of the normal fingerprint templates NT1 to NT6 and the dry fingerprint templates DT1 to DT4 of the fingerprint template FT, the fingerprint recognition unit FRP determines that the user authentication (fingerprint authentication) is failed. That is, when the template whose matching score with the fingerprint image is greater than the reference score does not exist in the normal fingerprint templates NT1 to NT6 and the dry fingerprint templates DT1 to DT4, the fingerprint recognition unit FRP determines that the user authentication (fingerprint authentication) is failed.

Figure 12:
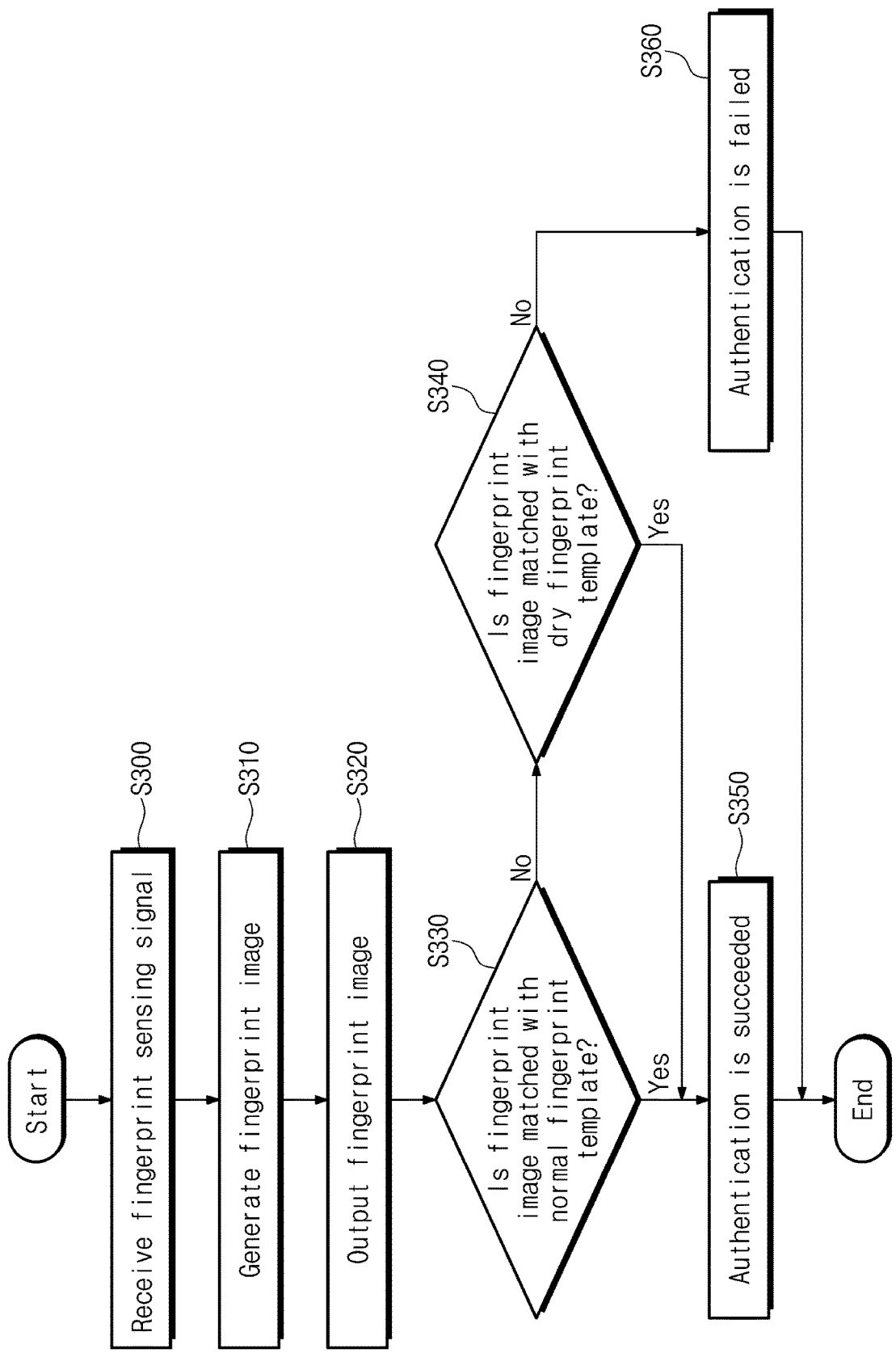
FIG. 12 is a flowchart showing an operation of the display device in a fingerprint authentication mode according to some example embodiments of the present disclosure.

FIG. 12 is a flowchart showing an operation of the display device in the fingerprint authentication mode according to some example embodiments of the present disclosure. For the convenience of explanation, the operation of the display device in the fingerprint authentication mode will be described as being performed in the readout circuit ROC shown in FIG. 8, however, the present disclosure should not be limited thereto or thereby. The fingerprint authentication mode of the display device may be performed by the control module CM shown in FIG. 2C or 3C.

Referring to FIG. 12, the fingerprint recognition unit FRP receives the fingerprint sensing signals RX1 to RXm from the fingerprint sensing pixels SP of the fingerprint sensing unit FSU shown in FIG. 7 (S300).

The fingerprint recognition unit FRP generates the fingerprint image corresponding to the fingerprint sensing signals RX1 to RXm (S310).

The fingerprint recognition unit FRP outputs the generated fingerprint image as the fingerprint image (S320). As an example, the fingerprint recognition unit FRP outputs the fingerprint image as the normal fingerprint image NF.

The fingerprint recognition unit FRP determines whether the fingerprint image matches with one of the normal fingerprint templates NT1 to NT6 of the fingerprint template FT stored in the memory MEM (S330).

When the fingerprint image matches with one of the normal fingerprint templates NT1 to NT6 of the fingerprint template FT stored in the memory MEM, the fingerprint recognition unit FRP determines that the user authentication (fingerprint authentication) is successful (S350). For instance, when the template whose matching score with the fingerprint image is greater than the reference score exists in the normal fingerprint templates NT1 to NT6 of the fingerprint template FT, the fingerprint recognition unit FRP determines that the user authentication (fingerprint authentication) is successful.

When the fingerprint image is not matched with any of the normal fingerprint templates NT1 to NT6 stored in the memory MEM, the fingerprint recognition unit FRP determines whether the fingerprint image matches with one of the dry fingerprint templates DT1 to DT4 of the fingerprint template FT stored in the memory MEM (S340).

When the fingerprint image matches with one of the dry fingerprint templates DT1 to DT4 of the fingerprint template FT stored in the memory MEM, the fingerprint recognition unit FRP determines that the user authentication (fingerprint authentication) is successful (S350). For instance, when the template whose matching score with the fingerprint image is greater than the reference score exists in dry fingerprint templates DT1 to DT4 of the fingerprint template FT, the fingerprint recognition unit FRP determines that the user authentication (fingerprint authentication) is successful.

When the fingerprint image is not matched with any of the dry fingerprint templates DT1 to DT4 stored in the memory MEM, the fingerprint recognition unit FRP determines that the user authentication (fingerprint authentication) is failed (S360).

Figure 13:
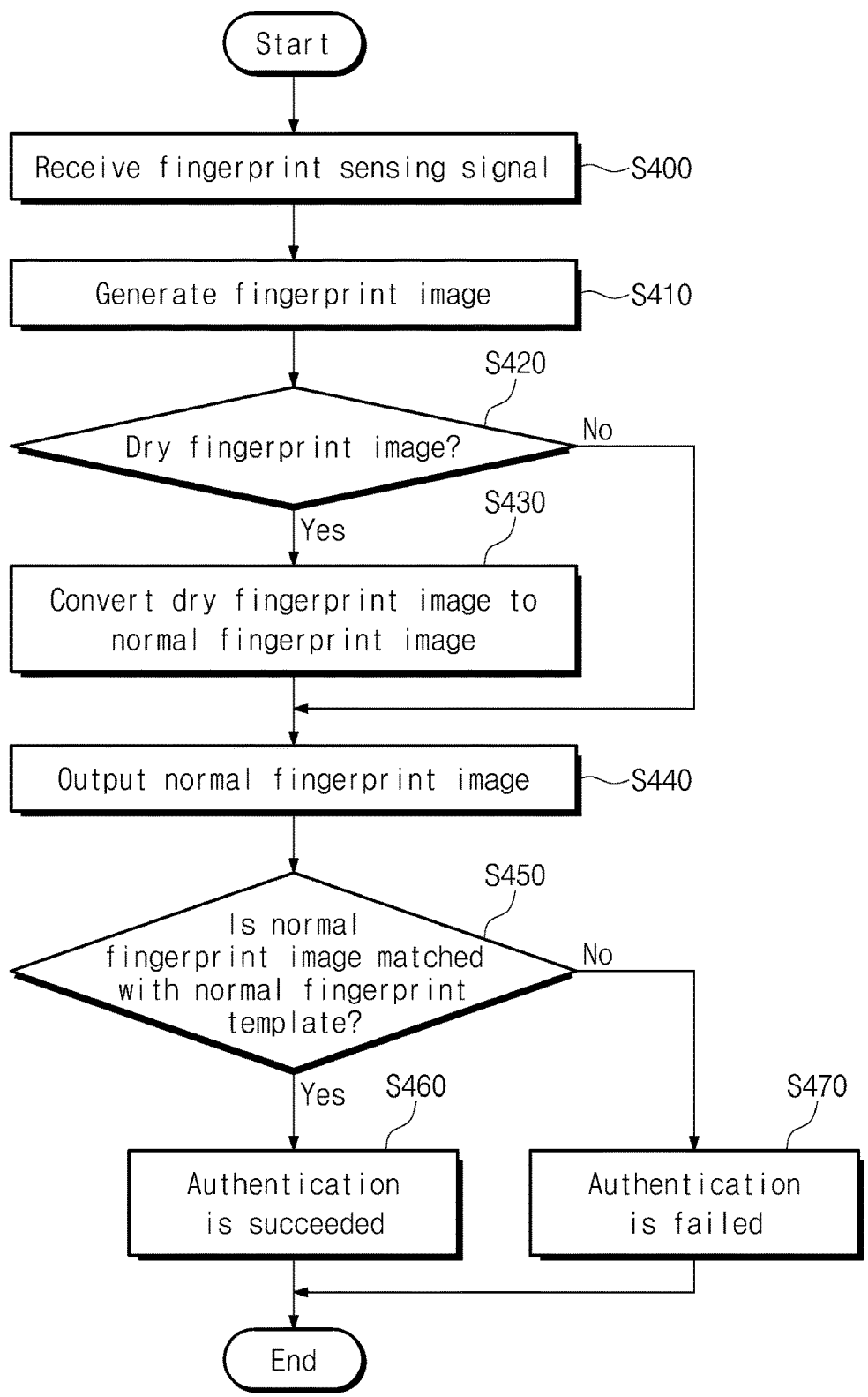
FIG. 13 is a flowchart showing an operation of the display device in a fingerprint authentication mode according to some example embodiments of the present disclosure.

FIG. 13 is a flowchart showing an operation of the display device in the fingerprint authentication mode according to some example embodiments of the present disclosure. For the convenience of explanation, the operation of the display device in the fingerprint authentication mode will be described as being performed in the readout circuit ROC shown in FIG. 8, however, the present disclosure should not be limited thereto or thereby. The fingerprint authentication mode of the display device may be performed by the control module CM shown in FIG. 2C or 3C.

Referring to FIG. 13, the fingerprint recognition unit FRP receives the fingerprint sensing signals RX1 to RXm from the fingerprint sensing pixels SP of the fingerprint sensing unit FSU shown in FIG. 7 (S400).

The fingerprint recognition unit FRP generates the fingerprint image corresponding to the fingerprint sensing signals RX1 to RXm (S410).

The fingerprint recognition unit FRP determines whether the generated fingerprint image is the dry fingerprint image (S420). For example, when the generated fingerprint image does not sufficiently include the information about the feature points, the fingerprint recognition unit FRP determines that the generated fingerprint image is the dry fingerprint image.

When it is determined that the generated fingerprint image is the dry fingerprint image, the fingerprint recognition unit FRP converts the generated fingerprint image to the normal fingerprint image (S430). The conversion of the generated fingerprint image to the normal fingerprint image NF is performed by the fingerprint recognition algorithm stored (e.g., as executable instructions to be executed by a processor, for example, included within the display device, or accessible by the display device, that cause in the memory MEM.

The fingerprint recognition unit FRP outputs the converted normal fingerprint image as the normal fingerprint image NF (S440).

When it is determined that the generated fingerprint image is not the dry fingerprint image in operation S420, the fingerprint recognition unit FRP outputs the generated fingerprint image as the normal fingerprint image NF.

The fingerprint recognition unit FRP determines whether the normal fingerprint image NF matches with one of the fingerprint templates FT stored in the memory MEM (S450).

When the normal fingerprint image NF matches with one of the fingerprint templates FT stored in the memory MEM, the fingerprint recognition unit FRP determines that the user authentication (fingerprint authentication) is successful (S460). For instance, when the template whose matching score with the normal fingerprint image NF is greater than the reference score exists in the fingerprint templates FT, the fingerprint recognition unit FRP determines that the user authentication (fingerprint authentication) is successful.

When the normal fingerprint image NF is not matched with any of the fingerprint templates FT stored in the memory MEM, the fingerprint recognition unit FRP determines that the user authentication (fingerprint authentication) is failed (S470).

The fingerprint recognition unit FRP that performs the above fingerprint authentication mode may reduce fingerprint authentication errors even though the user attempts to obtain the user authentication by inputting the fingerprint in the dry skin condition.

According to some example embodiments, the fingerprint recognition unit FRP may determine whether one of the normal fingerprint templates NT1 to NT6 of the fingerprint template FT stored in the memory MEM matches with the normal fingerprint image NF in operation S450.

Figure 14:
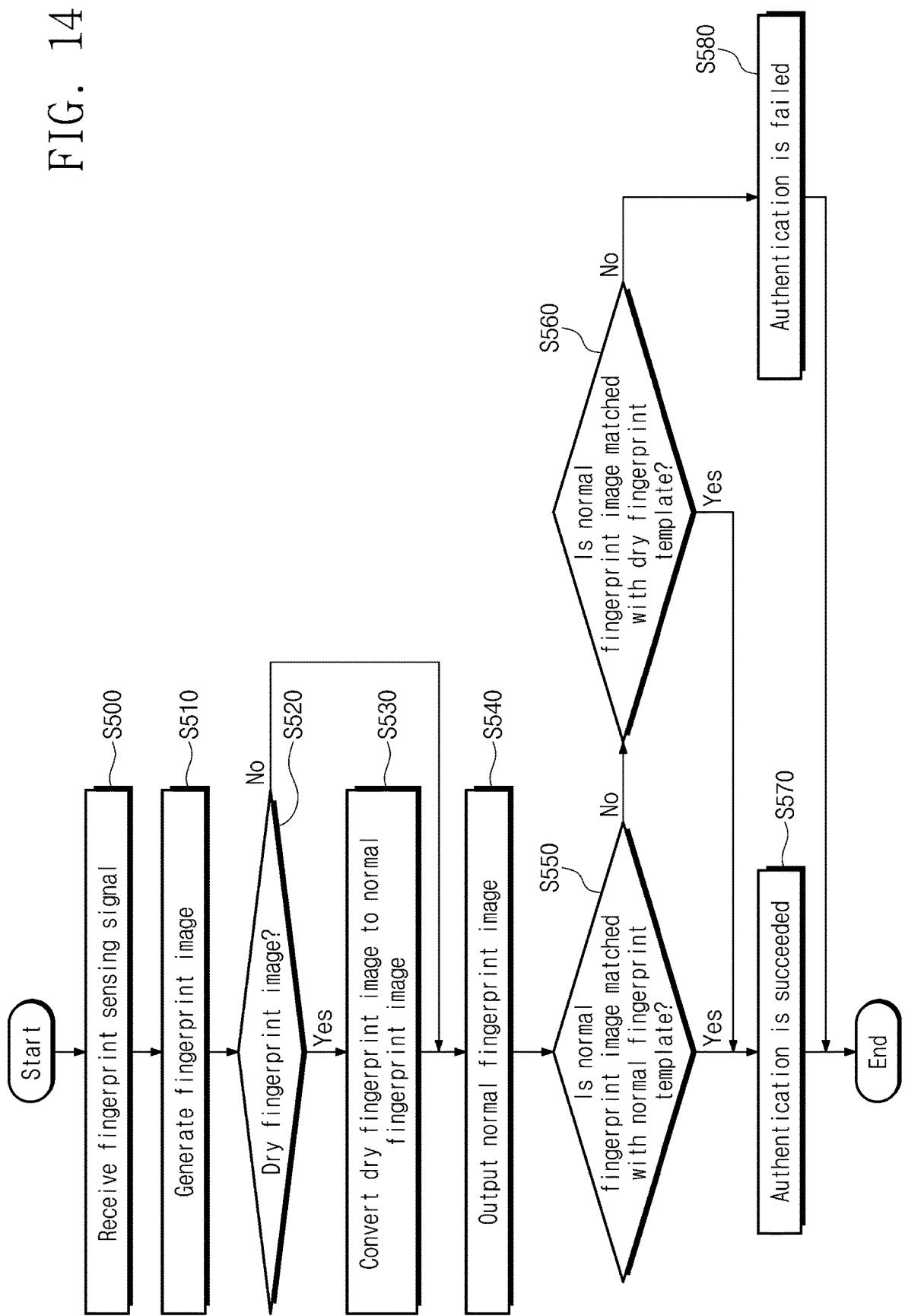
FIG. 14 is a flowchart showing an operation of the display device in a fingerprint authentication mode according to some example embodiments of the present disclosure.

FIG. 14 is a flowchart showing an operation of the display device in the fingerprint authentication mode according to some example embodiments of the present disclosure. For the convenience of explanation, the operation of the display device in the fingerprint authentication mode will be described as being performed in the readout circuit ROC shown in FIG. 8, however, the present disclosure should not be limited thereto or thereby. The fingerprint authentication mode of the display device may be performed by the control module CM shown in FIG. 2C or 3C.

Referring to FIG. 14, the fingerprint recognition unit FRP receives the fingerprint sensing signals RX1 to RXm from the fingerprint sensing pixels SP of the fingerprint sensing unit FSU shown in FIG. 7 (S500).

The fingerprint recognition unit FRP generates the fingerprint image corresponding to the fingerprint sensing signals RX1 to RXm (S510).

The fingerprint recognition unit FRP determines whether the generated fingerprint image is the dry fingerprint image (S520). For example, when the generated fingerprint image does not sufficiently include the information about the feature points, the fingerprint recognition unit FRP determines that the generated fingerprint image is the dry fingerprint image.

When it is determined that the generated fingerprint image is the dry fingerprint image, the fingerprint recognition unit FRP converts the generated fingerprint image to the normal fingerprint image NF (S530). The conversion of the generated fingerprint image to the normal fingerprint image NF is performed by the fingerprint recognition algorithm stored in the memory MEM.

The fingerprint recognition unit FRP outputs the converted normal fingerprint image as the normal fingerprint image NF (S540).

When it is determined that the generated fingerprint image is not the dry fingerprint image in operation S520, the fingerprint recognition unit FRP outputs the generated fingerprint image as the normal fingerprint image NF.

The fingerprint recognition unit FRP determines whether the normal fingerprint image NF matches with one of the normal fingerprint templates NT1 to NT6 of the fingerprint template FT stored in the memory MEM (S550).

When the normal fingerprint image NF matches with one of the normal fingerprint templates NT1 to NT6 of the fingerprint template FT stored in the memory MEM, the fingerprint recognition unit FRP determines that the user authentication (fingerprint authentication) is successful (S570). For instance, when the template whose matching score with the normal fingerprint image NF is greater than the reference score exists in the normal fingerprint templates NT1 to NT6 of the fingerprint template FT, the fingerprint recognition unit FRP determines that the user authentication (fingerprint authentication) is successful.

When the normal fingerprint image NF is not matched with any of the normal fingerprint templates NT1 to NT6 stored in the memory MEM, the fingerprint recognition unit FRP determines whether the normal fingerprint image NF matches with one of the dry fingerprint templates DT1 to DT4 of the fingerprint template FT stored in the memory MEM (S560).

When the normal fingerprint image NF matches with one of the dry fingerprint templates DT1 to DT4 of the fingerprint template FT stored in the memory MEM, the fingerprint recognition unit FRP determines that the user authentication (fingerprint authentication) is successful (S570). For instance, when the template whose matching score with the normal fingerprint image NF is greater than the reference score exists in the dry fingerprint templates DT1 to DT4 of the fingerprint template FT, the fingerprint recognition unit FRP determines that the user authentication (fingerprint authentication) is successful.

When the normal fingerprint image NF is not matched with any of the dry fingerprint templates DT1 to DT4 of the fingerprint templates FT stored in the memory MEM in operation S560, the fingerprint recognition unit FRP determines that the user authentication (fingerprint authentication) is failed (S580).

The fingerprint recognition unit FRP that performs the above fingerprint authentication mode may reduce fingerprint authentication errors even though the user attempts to obtain the user authentication by inputting the fingerprint in the dry skin condition.

Figure 15A:
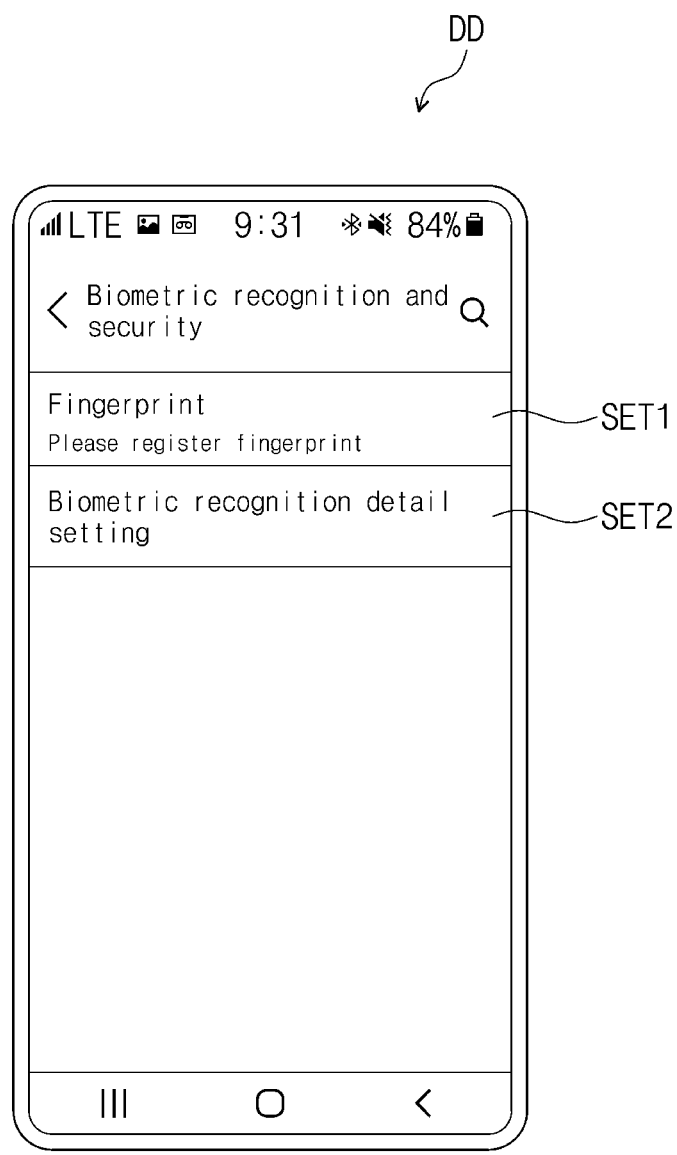
FIGS. 15A and 15B are views showing a user interface screen displayed through the display device in the fingerprint registration mode according to some example embodiments of the present disclosure.
Figure 15B:
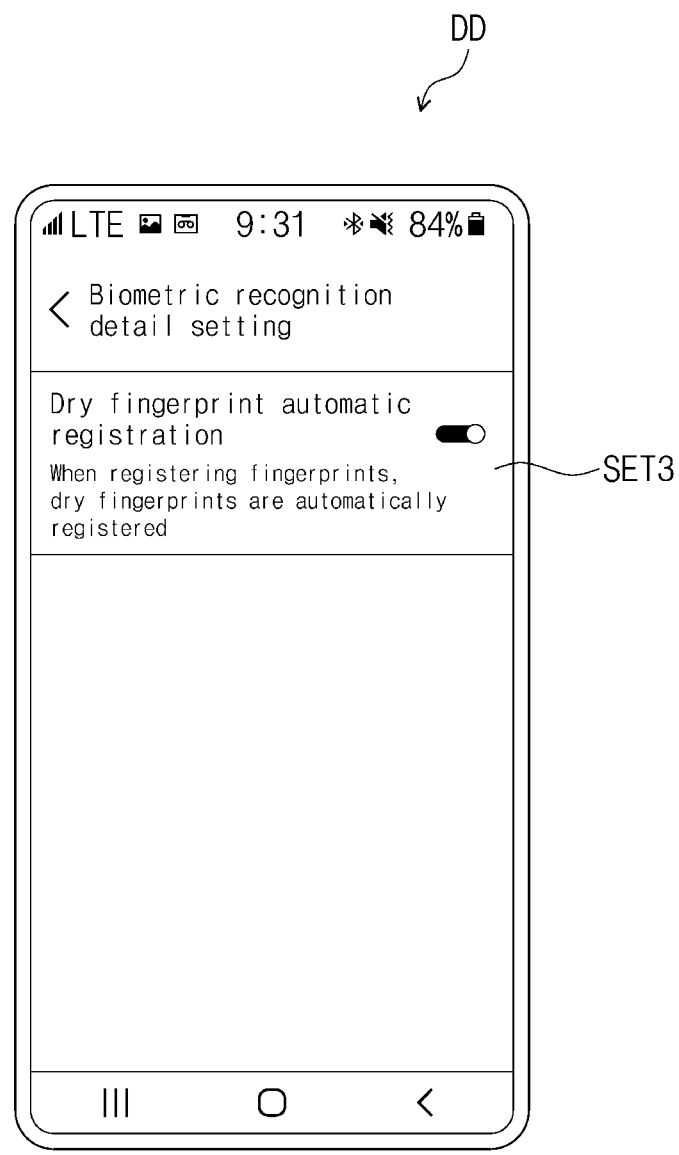

FIGS. 15A and 15B are views showing a user interface screen displayed through the display device DD in the fingerprint registration mode.

Referring to FIG. 15A, the user may select a first setting SET1 displayed in the display device DD in the fingerprint registration mode to register the user's fingerprint. In addition, the user may select a second setting SET2 displayed in the display device DD to register a biometric recognition detail setting. When the user selects (touches) the second setting SET2, a screen shown in FIG. 15B may be displayed in the display device DD.

Referring to FIG. 15B, the user may touch a third setting SET3 displayed in the display device DD to select a dry fingerprint automatic registration. When the user touches the third setting SET3 to switch the dry fingerprint automatic registration to "ON" state, the fingerprint registration mode shown in FIG. 10 may be performed.

As described in FIG. 10, the fingerprint recognition unit FRP may automatically register not only the normal fingerprint template corresponding to the fingerprint input by the user but also the dry fingerprint template during the fingerprint registration mode.

The display device DD in which the normal fingerprint template and the dry fingerprint template are registered may determine whether the fingerprint input by the user matches with the normal fingerprint template and the dry fingerprint template during the fingerprint authentication mode, and thus, the fingerprint authentication errors may be reduced in the state where the user's skin is dry.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present invention.

Although aspects of some example embodiments of the present disclosure have been described, it is understood that embodiments according to the present disclosure should not be limited to these example embodiments but various changes and modifications can be made by one ordinary skilled in the art within the spirit and scope of embodiments according to the present disclosure as hereinafter claimed. Therefore, the disclosed subject matter should not be limited to any single embodiment described herein, and the scope of embodiments according to the present inventive concept shall be determined according to the attached claims and their equivalents.

What is claimed is:

1. A display device comprising:
a display unit configured to display an image;
a fingerprint sensing unit on one surface of the display unit and comprising fingerprint sensing pixels configured to sense a fingerprint; and
a readout circuit configured to receive a fingerprint sensing signal from the fingerprint sensing pixels, wherein the readout circuit is configured to generate and output a normal fingerprint image and a dry fingerprint image, which correspond to the fingerprint sensing signal, during a fingerprint registration mode,
wherein the readout circuit is configured to output the normal fingerprint image and the dry fingerprint image based on a matching score of the dry fingerprint image and the normal fingerprint image.

2. The display device of claim 1, wherein the readout circuit is configured to generate the dry fingerprint image corresponding to the fingerprint sensing signal and to output the dry fingerprint image in response to the matching score of the dry fingerprint image and the normal fingerprint image being greater than a reference score.

3. The display device of claim 1, wherein the readout circuit further comprises a memory configured to store instructions that, when executed by a processor, cause the processor to generate the dry fingerprint image corresponding to the fingerprint sensing signal, and the readout circuit is configured to calculate a matching score indicating a match degree of the dry fingerprint image and the normal fingerprint image.

4. The display device of claim 1, wherein the readout circuit is configured to output a fingerprint template comprising a normal fingerprint template corresponding to the normal fingerprint image and a dry fingerprint template corresponding to the dry fingerprint image.

5. The display device of claim 4, wherein the fingerprint template comprises a plurality of normal fingerprint templates and a plurality of dry fingerprint templates.

6. The display device of claim 4, wherein the readout circuit is configured to generate a fingerprint image corresponding to the fingerprint sensing signal during a fingerprint authentication mode and to compare the generated fingerprint image with the fingerprint template.

7. The display device of claim 4, wherein the readout circuit is configured to generate the dry fingerprint image corresponding to the fingerprint sensing signal during a fingerprint authentication mode, to convert the dry fingerprint image to the normal fingerprint image, and to compare the normal fingerprint image with the fingerprint template.

8. The display device of claim 4, wherein the readout circuit further comprises a memory configured to store the fingerprint template.

9. The display device of claim 1, wherein the display unit comprises a display area at which light emitting pixels are arranged and a non-display area adjacent to the display area, and the fingerprint sensing pixels of the fingerprint sensing unit are in a fingerprint sensing area corresponding to the display area.

10. The display device of claim 1, wherein each of the fingerprint sensing pixels is connected to a corresponding fingerprint scan line among a plurality of fingerprint scan lines and a corresponding fingerprint sensing line among a plurality of fingerprint sensing lines, and the fingerprint sensing unit further comprises a fingerprint scan driving circuit configured to sequentially drive the fingerprint scan lines.

11. The display device of claim 10, wherein the readout circuit is configured to receive the fingerprint sensing signal from the fingerprint sensing lines.

12. A method of operating a display device in a fingerprint registration mode and a fingerprint authentication mode, the method comprising:
identifying the display device is in the fingerprint registration mode;
receiving a fingerprint sensing signal;
generating a normal fingerprint image corresponding to the fingerprint sensing signal;
generating a dry fingerprint image corresponding to the fingerprint sensing signal; and
outputting the normal fingerprint image and the dry fingerprint image based on a matching score of the normal fingerprint image and the dry fingerprint image.

13. The method of claim 12, wherein the outputting of the normal fingerprint image and the dry fingerprint image comprises outputting the normal fingerprint image and the dry fingerprint image in response to the normal fingerprint image matching with the dry fingerprint image.

14. The method of claim 12, wherein the outputting of the normal fingerprint image and the dry fingerprint image comprises outputting the normal fingerprint image and the dry fingerprint image in response to the matching score of the normal fingerprint image and the dry fingerprint image being greater than a reference score.

15. The method of claim 12, further comprising outputting a fingerprint template comprising a normal fingerprint template corresponding to the normal fingerprint image and a dry fingerprint template corresponding to the dry fingerprint image.

16. The method of claim 15, further comprising:
- identifying the display device is in the fingerprint authentication mode;
- receiving the fingerprint sensing signal;
- generating a fingerprint image corresponding to the fingerprint sensing signal;
- comparing the fingerprint image with the fingerprint template; and
- determining that a user authentication is successful in response to the fingerprint image matching with the fingerprint template.

17. The method of claim 16, further comprising, after identifying the display device is in the fingerprint authentication mode:
- comparing the fingerprint image with the normal fingerprint template in the fingerprint template; and
- comparing the fingerprint image with the dry fingerprint template in the fingerprint template in response to the fingerprint image not matching with the normal fingerprint template.

18. The method of claim 16, further comprising determining that the user authentication is successful in response to the fingerprint image matching at least one of the normal fingerprint template or the dry fingerprint template.

19. The method of claim 16, wherein the generating of the fingerprint image corresponding to the fingerprint sensing signal comprises:
- determining whether or not the fingerprint image is a dry fingerprint image;
- converting the dry fingerprint image to the normal fingerprint image in response to determining that the fingerprint image is the dry fingerprint image;
- comparing the normal fingerprint image with the normal fingerprint template in the fingerprint template; and
- comparing the normal fingerprint image with the dry fingerprint template in the fingerprint template in response to the normal fingerprint image not matching with the normal fingerprint template.

20. The method of claim 12, wherein the generating of the dry fingerprint image corresponding to the fingerprint sensing signal in the fingerprint registration mode is performed in response to a dry fingerprint automatic registration being selected by a user.

* * * * *